(12) United States Patent
Daghighian et al.

(10) Patent No.: US 10,667,388 B2
(45) Date of Patent: May 26, 2020

(54) OPTICAL WAVEGUIDE HAVING ALUMINUM NITRIDE THIN FILM

(71) Applicant: FINISAR CORPORATION, Sunnyvale, CA (US)

(72) Inventors: Henry Meyer Daghighian, Redwood City, CA (US); Steven C. Bird, San Jose, CA (US)

(73) Assignee: II-VI Delaware Inc., Wilmington, DE (US)

(*) Notice: Subject to any disclaimer, the term of this patent is extended or adjusted under 35 U.S.C. 154(b) by 0 days.

(21) Appl. No.: 16/673,719

(22) Filed: Nov. 4, 2019

(65) Prior Publication Data
US 2020/0068706 A1    Feb. 27, 2020

Related U.S. Application Data

(60) Division of application No. 15/138,116, filed on Apr. 25, 2016, now Pat. No. 10,470,302, which is a
(Continued)

(51) Int. Cl.
| H05K 1/02 | (2006.01) |
|---|---|
| H05K 1/03 | (2006.01) |

(Continued)

(52) U.S. Cl.
CPC .......... *H05K 1/0274* (2013.01); *G02B 6/122* (2013.01); *G02B 6/124* (2013.01); *G02B 6/12007* (2013.01); *G02B 6/1221* (2013.01); *G02B 6/132* (2013.01); *G02B 6/136* (2013.01); *G02B 6/42* (2013.01); *H01P 3/081* (2013.01); *H05K 1/0201* (2013.01); *H05K 1/0207* (2013.01); *H05K 1/028* (2013.01); *H05K 1/032* (2013.01);
(Continued)

(58) Field of Classification Search
CPC ........ H05K 1/0274; H05K 1/09; H05K 1/115; H05K 1/032; H05K 1/028; H05K 1/0207; H05K 1/0201; H05K 1/024; H05K 1/0209; H05K 3/4688; H05K 3/4611; H05K 3/323; H05K 3/4614; H05K 3/4605; H05K 3/4638; H05K 2201/0154; H05K 2201/09918; H01P 3/081; G02B 6/136; G02B 6/132; G02B 6/42; G02B 6/1221; G02B 6/122; G02B 6/12007; G02B 6/124; G02B 6/4269; G02B 6/4214; G02B 2006/12035; G02B 2006/12164; G02B 2006/121; G02B 2006/12107; G02B 2006/12104
See application file for complete search history.

(56) References Cited

U.S. PATENT DOCUMENTS

| 4,949,224 | A | * | 8/1990 | Yamamura | ........ | H01L 23/49572 |
|---|---|---|---|---|---|---|
| | | | | | | 257/E21.511 |
| 5,578,869 | A | * | 11/1996 | Hoffman | ............... | H01L 23/057 |
| | | | | | | 257/691 |

(Continued)

*Primary Examiner* — Andrew Jordan
(74) *Attorney, Agent, or Firm* — Maschoff Brennan

(57) ABSTRACT

An optical waveguide is disclosed. In a disclosed embodiment, the optical waveguide includes a first aluminum nitride (AlN) thin film disposed on a layer of high-frequency polymer. A second AlN thin film is embedded in the first AlN thin film. In disclosed embodiments, the nitrogen concentration level of the first AlN thin film is different than the concentration level of the second AlN thin film.

6 Claims, 24 Drawing Sheets

Related U.S. Application Data continuation of application No. 14/680,719, filed on Apr. 7, 2015, now Pat. No. 9,326,373.

(60) Provisional application No. 61/977,410, filed on Apr. 9, 2014.

(51) Int. Cl.

| | |
|---|---|
| *H05K 1/11* | (2006.01) |
| *G02B 6/132* | (2006.01) |
| *G02B 6/124* | (2006.01) |
| *G02B 6/122* | (2006.01) |
| *G02B 6/12* | (2006.01) |
| *G02B 6/42* | (2006.01) |
| *H05K 3/46* | (2006.01) |
| *G02B 6/136* | (2006.01) |
| *H01P 3/08* | (2006.01) |
| *H05K 1/09* | (2006.01) |
| *H05K 3/32* | (2006.01) |

(52) U.S. Cl.
CPC ............ *H05K 1/09* (2013.01); *H05K 1/115* (2013.01); *H05K 3/4688* (2013.01); *G02B 6/4214* (2013.01); *G02B 6/4269* (2013.01); *G02B 2006/121* (2013.01); *G02B 2006/12035* (2013.01); *G02B 2006/12104* (2013.01); *G02B 2006/12107* (2013.01); *G02B 2006/12164* (2013.01); *H05K 1/024* (2013.01); *H05K 1/0209* (2013.01); *H05K 3/323* (2013.01); *H05K 3/4605* (2013.01); *H05K 3/4611* (2013.01); *H05K 3/4614* (2013.01); *H05K 3/4638* (2013.01); *H05K 2201/0154* (2013.01); *H05K 2201/09918* (2013.01)

(56) References Cited

U.S. PATENT DOCUMENTS

| | | | | |
|---|---|---|---|---|
| 5,653,379 A * | 8/1997 | Forster | ................ | B23K 35/007 228/122.1 |
| 6,451,418 B1 * | 9/2002 | Tobita | ................ | C08J 5/046 174/212 |
| 6,579,398 B1 * | 6/2003 | Ogawa | ................ | G02B 6/138 156/230 |
| 6,762,496 B2 * | 7/2004 | Yamamoto | ............. | B32B 18/00 257/701 |
| 6,785,458 B2 * | 8/2004 | Mule' | ................ | G02B 6/10 385/131 |
| 7,224,046 B2 * | 5/2007 | Abe | ................ | H01L 23/49822 174/255 |
| 7,245,647 B2 * | 7/2007 | Jikutani | ................ | B82Y 20/00 372/50.11 |
| 7,271,461 B2 * | 9/2007 | Dutta | ................ | G02B 6/12002 257/432 |
| 7,486,517 B2 * | 2/2009 | Aapro | ................ | H04M 1/026 165/104.33 |
| 7,640,660 B2 * | 1/2010 | Abe | ................ | H01L 23/49822 174/255 |
| 7,796,399 B2 * | 9/2010 | Clayton | ................ | H05K 1/189 174/257 |
| 8,034,724 B2 * | 10/2011 | Shimomura | ........ | H01L 21/2026 438/769 |
| 8,063,315 B2 * | 11/2011 | Das | ................ | H05K 3/4623 174/262 |
| 8,269,410 B2 * | 9/2012 | Kijima | ................ | C09K 11/661 313/485 |
| 8,592,233 B2 * | 11/2013 | Kriman | ................ | H01L 27/14618 438/28 |
| 8,708,576 B2 * | 4/2014 | Shacklette | ............ | G02B 6/4212 385/14 |
| 9,000,474 B2 * | 4/2015 | Muramatsu | ........ | H05K 1/0201 257/100 |
| 9,029,891 B2 * | 5/2015 | Muramatsu | ............ | H01L 33/60 257/676 |
| 9,084,372 B2 * | 7/2015 | Muramatsu | .......... | H05K 7/2039 |
| 9,086,209 B2 * | 7/2015 | Park | ................ | F21V 15/012 |
| 9,326,373 B2 * | 4/2016 | Daghighian | ........ | G02B 6/1221 |
| 9,478,491 B1 * | 10/2016 | Zhang | ............... | H01L 21/76879 |
| 9,648,735 B2 * | 5/2017 | Mahler | ............... | H05K 1/032 |
| 9,826,623 B2 * | 11/2017 | Koukami | ............ | H01L 23/3737 |
| 9,986,636 B2 * | 5/2018 | Mahler | ................ | H05K 3/105 |
| 10,470,302 B2 * | 11/2019 | Daghighian | ............ | H01P 3/081 |
| 2004/0047539 A1 * | 3/2004 | Okubora | ................ | G02B 6/13 385/14 |
| 2004/0210289 A1 * | 10/2004 | Wang | ................... | A61K 9/5094 607/116 |
| 2005/0218503 A1 * | 10/2005 | Abe | ................ | H01L 23/49822 257/700 |
| 2006/0012967 A1 * | 1/2006 | Asai | ........................ | G02B 6/43 361/764 |
| 2006/0183625 A1 * | 8/2006 | Miyahara | ............... | C04B 35/053 501/98.4 |
| 2007/0006452 A1 * | 1/2007 | Egitto | ................... | H05K 3/4069 29/832 |
| 2007/0096272 A1 * | 5/2007 | Wang | ................... | H01L 33/483 257/675 |
| 2007/0186414 A1 * | 8/2007 | Abe | ................ | H01L 23/49822 29/830 |
| 2007/0221404 A1 * | 9/2007 | Das | ...................... | H05K 3/4623 174/264 |
| 2007/0232734 A1 * | 10/2007 | Kanakarajan | .......... | C08G 73/10 524/413 |
| 2008/0020555 A1 * | 1/2008 | Shimomura | ........ | H01L 21/2026 438/487 |
| 2008/0043796 A1 * | 2/2008 | Jikutani | ................ | B82Y 20/00 372/50.11 |
| 2009/0016671 A1 * | 1/2009 | Asai | ........................ | G02B 6/43 385/14 |
| 2010/0085713 A1 * | 4/2010 | Balandin | ............... | H01L 23/373 361/705 |
| 2010/0195954 A1 * | 8/2010 | Asai | ........................ | G02B 6/43 385/14 |
| 2011/0001418 A1 * | 1/2011 | Tsai | ...................... | H05K 1/053 313/46 |
| 2011/0006334 A1 * | 1/2011 | Ishii | ...................... | C09K 11/584 257/98 |
| 2011/0013865 A1 * | 1/2011 | Shibata | ................ | G02B 6/138 385/14 |
| 2011/0041903 A1 * | 2/2011 | Zehavi | ............... | H01L 31/02165 136/255 |
| 2012/0007078 A1 * | 1/2012 | Shimomura | ........ | H01L 21/2026 257/52 |
| 2012/0017437 A1 * | 1/2012 | Das | ...................... | H05K 3/4623 29/852 |
| 2012/0033429 A1 * | 2/2012 | Van De Ven | ....... | H05B 33/0803 362/294 |
| 2012/0055702 A1 * | 3/2012 | Rathburn | ............ | H01L 23/4985 174/254 |
| 2012/0112235 A1 * | 5/2012 | Preuschl | ............... | H05K 1/189 257/98 |
| 2012/0267997 A1 * | 10/2012 | Kijima | ................ | C09K 11/661 313/498 |
| 2013/0187174 A1 * | 7/2013 | Tischler | ................ | H01L 27/14 257/80 |
| 2013/0187182 A1 * | 7/2013 | Muramatsu | ................ | H01L 33/60 257/98 |
| 2013/0187190 A1 * | 7/2013 | Muramatsu | .......... | H05K 1/0201 257/99 |
| 2013/0188361 A1 * | 7/2013 | Muramatsu | .......... | H05K 7/2039 362/296.01 |
| 2013/0209698 A1 * | 8/2013 | Schlesinger | ........ | C23C 18/1855 427/443.1 |
| 2013/0335975 A1 * | 12/2013 | Park | ................ | F21S 43/195 362/297 |
| 2014/0061705 A1 * | 3/2014 | Tischler | ................ | H01L 27/14 257/98 |
| 2014/0073013 A1 * | 3/2014 | Gorman | ................... | B01L 7/52 435/91.2 |

(56) References Cited

U.S. PATENT DOCUMENTS

| | | | |
|---|---|---|---|
| 2014/0076618 A1* | 3/2014 | Cho | H05K 3/244 |
| | | | 174/257 |
| 2014/0321069 A1* | 10/2014 | Gouchi | H05K 1/16 |
| | | | 361/728 |
| 2015/0044425 A1* | 2/2015 | Iwashita | C08J 7/123 |
| | | | 428/172 |
| 2015/0168646 A1* | 6/2015 | Arai | G02B 6/122 |
| | | | 385/14 |
| 2015/0228869 A1* | 8/2015 | Yoo | H01L 33/54 |
| | | | 362/97.3 |
| 2015/0296610 A1* | 10/2015 | Daghighian | H05K 3/4688 |
| | | | 385/14 |
| 2015/0359091 A1* | 12/2015 | Mahler | H05K 1/032 |
| | | | 174/258 |
| 2016/0157334 A1* | 6/2016 | Koukami | H01L 23/3737 |
| | | | 361/705 |
| 2016/0323992 A1* | 11/2016 | Daghighian | G02B 6/136 |
| 2017/0208684 A1* | 7/2017 | Mahler | H05K 1/032 |
| 2017/0307756 A1* | 10/2017 | Lee | G01S 15/8911 |
| 2019/0073505 A1* | 3/2019 | Kwon | G01B 11/24 |

* cited by examiner

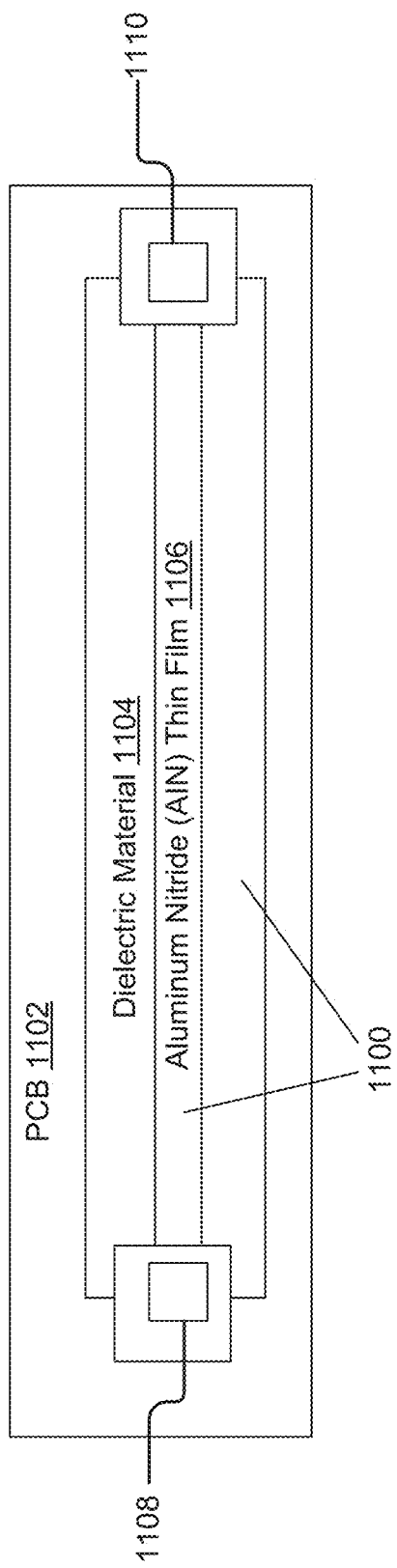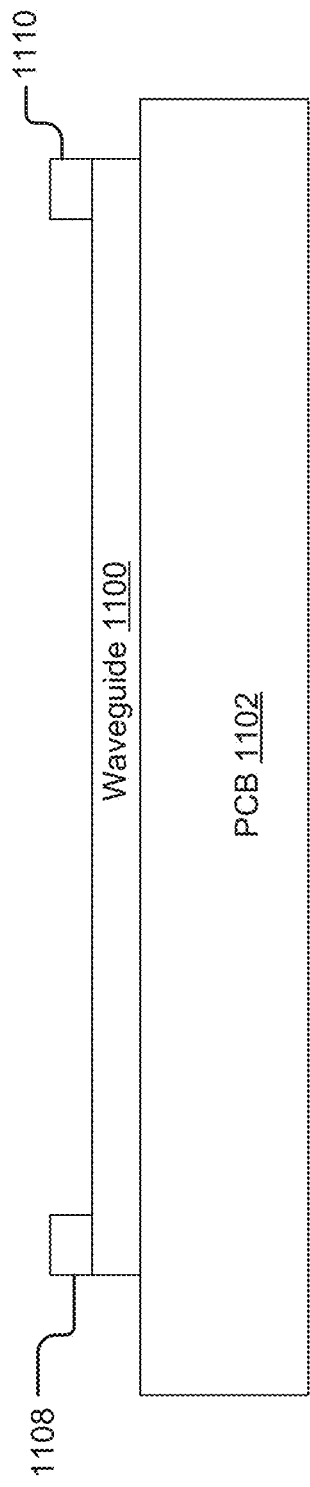
Figure 11A
Figure 11B

OPTICAL WAVEGUIDE HAVING ALUMINUM NITRIDE THIN FILM

CROSS-REFERENCE TO RELATED APPLICATIONS

This application is a divisional application of U.S. application Ser. No. 15/138,116, entitled "ALUMINUM NITRIDE SUBSTRATE WITH GRAPHITE FOIL", filed Apr. 25, 2016, which is a continuation of U.S. application Ser. No. 14/680,719, which claims the benefit of U.S. Provisional Application No. 61/977,410, entitled "Printed Circuit Board Including Aluminum Nitride" filed Apr. 9, 2014, all of which are incorporated herein by reference in their entireties.

FIELD

Some embodiments described herein generally relate to printed circuit boards.

BACKGROUND

Unless otherwise indicated herein, the materials described herein are not prior art to the claims in the present application and are not admitted to be prior art by inclusion in this section.

Active heat loads such as active integrated circuits (ICs) may be mounted on top of heat sinks on a printed circuit board (PCB) and may generate heat during operation. Inefficient heat removal from the active loads may affect the performance of the active loads and/or the PCB. For example, in high-frequency applications (e.g., ≥25 gigabits per second), performance of the active loads and/or PCB may be degraded significantly if the heat is not removed efficiently. Existing technologies may rely on thermal vias to remove the heat in the z direction (e.g., orthogonal to the plane of the PCB). The vias are hollow holes filled with thermal conductive materials such as copper and may take up a substantial portion of space on the PCB. The vias may create bumps under the active loads and may also cause flatness issues. Signal routing on the PCB may be affected by the distribution of the vias on the PCB. Alternatively or additionally, existing technologies may use coining to create local thermal pools directly underneath the active loads and to remove the heat from the active loads. Coining may also interfere with signal paths on the PCB.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to techniques for constructing an optical waveguide.

In an example embodiment, an optical waveguide may include a layer of high-frequency polymer. The optical waveguide may include a first aluminum nitride (AlN) thin film disposed on top of the layer of high-frequency polymer. The first AlN thin film may include nitrogen content with a first nitrogen concentration level and a first index of refraction. The optical waveguide may include a second AlN thin film embedded in the first AlN thin film. The second AlN thin film may include nitrogen content with a second nitrogen concentration level and a second index of refraction. The first nitrogen concentration level may be lower than the second nitrogen concentration level. The first index of refraction may be lower than the second index of refraction. The second AlN thin film may be embedded in the first AlN thin film to guide a light beam to propagate through the second AlN thin film.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 11A is a block diagram illustrating a top view of an example chip-to-chip optical communication routing through a waveguide;

FIG. 11B is a block diagram illustrating a side view of the example chip-to-chip optical communication routing through the waveguide of FIG. 11A;

DETAILED DESCRIPTION OF SOME EXAMPLE EMBODIMENTS

Figure 1A:
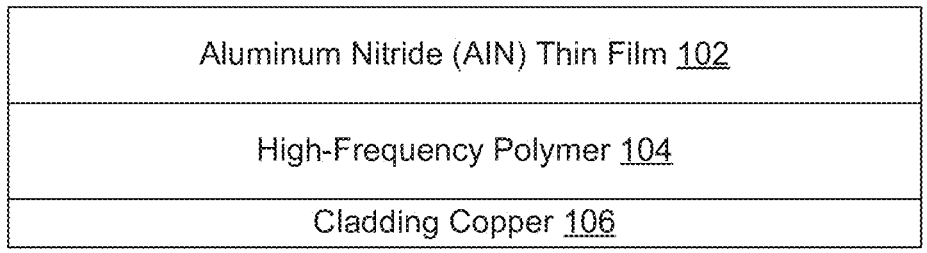
FIGS. 1A-5 are block diagrams illustrating cross-sectional views of stack-ups of various example aluminum nitride (AlN) substrates.

Embodiments described herein generally relate to techniques for constructing printed circuit boards (PCBs) using aluminum nitride (AlN).

Some embodiments described herein may include an AlN substrate formed by an AlN thin film on a layer of high-frequency polymer. The layer of high-frequency polymer may include polyimide, kapton, amorphous glass, or another suitable type of dielectric material. For example, the AlN substrate may include an AlN thin film in a polycrystalline form deposited on a thin layer of polyimide, kapton or any other suitable bonding material. The AlN thin film may include dielectric material with a higher lateral and/or vertical thermal conductivity compared to other dielectric materials such as glass reinforced dielectric materials (e.g., FR-4 or PRE-PREG materials). For example, the AlN dielectric material may have a thermal conductivity between 4 watts per meter kelvin (W/m–K) and 10 W/m–K. In comparison, a thermal conductivity of some regular dielectric materials may be about 0.2-0.3 W/m–K. In some embodiments, better homogeneity may be achieved using AlN dielectric material compared to using other dielectric materials including fiber glass weaves. The AlN substrate may be used to form a top layer, a bottom layer, a core layer, or another selected layer of a PCB.

The AlN substrate may be in a flexible form and may include a thickness between 10 micrometers and 100 micrometers. The AlN substrate may be constructed using various deposition techniques including, but not limited to, direct current (DC) reactive magnetic sputtering, plasma vapor deposition, chemical vapor deposition, plasma immersion ion implantation, and any other suitable type of deposition technique.

Metallization of the AlN substrate may be implemented through metallization deposition techniques, yielding smooth and even metal patterns on surfaces of the AlN substrate. Example metallization deposition techniques may include, but are not limited to, titanium (Ti)/Ti silicon nitride (SiN)/gold (Au), Ti/platinum (Pt)/Au, Ti-Tungstent (W)/Au, chromium-copper (Cr—Cu), Cr—Au, Ti—W/nickel (Ni)—Cu, TaN—Cr—Au, Ti-palladium (Pd)—Au, molybdenum (Mo)-manganese (Mn), eletro less copper, silver, electro less titanium electro less palladium immersion gold (ETIG), and deposition using other suitable metals or metal alloys.

The AlN substrate may be transparent and may be surrounded by dielectric material with a permittivity (or, an index of refraction) lower than AlN, so that the aluminum substrate may form an optical waveguide. Thus, chip-to-chip optical communication may be routed through the AlN substrate.

The AlN substrate may be sufficiently thin (e.g., with a thickness no greater than 30 micrometers such as 15 micrometers, 20 micrometers, or 25 micrometers) and may have high quality microwave capability (e.g., high dielectric constant (e.g., Dk>6) and low dissipation factor (e.g., Df<0.01)). If the AlN substrate forms a top layer and/or a bottom layer of a PCB, traces and/or transmission lines with super fine geometries may be deposited on a top side and/or a bottom side of the PCB for massive parallel photonic circuit architectures. For example, pairs of micro strip lines with a trace width of about 10 micrometers to 65 micrometers and a trace pitch width of about 15 micrometers to 200 micrometers may be deposited on the top side and/or the bottom side of the PCB.

In some embodiments, the AlN substrate may be bonded to a main substrate to form a PCB. The AlN substrate may include an AlN thin film that may be deposited on a thin layer of polyimide, kapton, or any other suitable bonding material. The main substrate may adhere to the AlN substrate and may include PRE-PREG layers, metal layers, layers of polyimide or kapton, and other circuit board layers. The PCB may include a rigid board or a flexible board. The main substrate may include one or more circuit board layers. The AlN substrate may be aligned with the main substrate using fiducial alignment. The AlN substrate and its electrically conductive vias may be bonded to the main substrate using one or more of: (1) wafer scale thermal compression bonding; (2) a PCB PRE-PREG attaching process; (3) a thermosetting conductive bonding film such as CBF-300 or another suitable type of bonding film; (4) backfilling through vias on the main substrate with electro-deposited copper to form contact with vias on the AlN substrate; and (5) other suitable bonding techniques. Alternatively, the AlN substrate may be bonded to kapton or may stand by itself so that a layer of high-frequency polymer (e.g., polyimide) may hold the AlN substrate together.

The construction of a PCB with an AlN substrate may improve heat dissipation in the PCB compared to using other dielectric materials such as dielectric materials with fiber glass weaves. The AlN substrate may act as a thermal heat spreader to provide a wider area for heat dissipation compared to using coining and may allow heat to flow laterally in the x-y directions (e.g., in the plane of the PCB). Thus, heat may be spread efficiently in the x-y directions by the AlN substrate as well as in the z-direction using vias. Lateral heat flow provided by a heat spreader layer that includes an AlN substrate may be beneficial for heat removal and/or heat dissipation in the PCB.

Example applications of the AlN substrates described herein may include combining the AlN substrates with flexible electronic devices including integrated circuits (ICs) made of amorphous silicon, organic semiconductor(s) and/or graphene. The flexible electronic devices may include wearable electronic devices such as smart watches, wristband activity tracking devices, and/or any other wearable devices.

With reference to detailed description provided below, example advantages of the AlN substrate will be more obvious. For example, the AlN substrate may be in a flexible foil form. The AlN substrate may have a higher lateral and/or vertical thermal conductivity (e.g., K>4 or 10 W/m–k) than standard dielectric core or PRE-PREG materials, and may act as an efficient thermal heat spreader. The AlN substrate may be capable of implementing high isolation microwave circuitry and/or optical devices on a PCB architecture without laminates such as high-temperature co-fired ceramics (HTCC) or low-temperature co-fired ceramics (LTCC). The AlN substrate may make 100% flip chip bondable mixed signal and/or optical daughter (or mother) substrate on a PCB (or a flex circuitry) to be possible. The PCB may be a flex, semi-rigid, or rigid PCB. The AlN substrate may eliminate use of expensive laminate omicrowave substrates and utilize a PCB architecture with use of a sequential lamination of polycrystalline AlN and polyimide. The AlN substrate may be a flexible multi-purpose AlN and polyimide substrate and may be environmentally robust with flexural strength.

For example, the AlN substrate does not include fiber weave or glass weave and may be utilized to form fine or super fine transmission lines (e.g., with a width<50 micron, an impedance of 50 or 100 ohms) and 50 G controlled impedance lines. The AlN substrate may form surface-mount technology (SMT) assembly with copper, gold, silver, nickel, or palladium based metallization. The palladium based metallization may be used to improve durability and wire bonding.

For example, the AlN substrate may form an optical waveguide, an optical grating, or an optical prism with an AlN (or AlNx) trench waveguide and onboard grating architecture. The AlN substrate may be 85%-90% transparent for wavelengths between 850 nanometers and 1550 nanometers. The optical attenuation may be controllable. In some embodiments, optical routers, multiplexers, and/or demultiplexers may be fabricated on flexible AlN or aluminum oxide ($Al_2O_3$) substrate, with trench or ridge waveguides formed with AlN or $Al_2O_3$.

For example, implementation of the AlN substrate is compatible with existing processes (e.g., sequential lamination processes, laser drilling processes, various metallization processes). The AlN substrate may be easy to drill and cut. The AlN substrate may allow for reduction and non-invasive substrate development without massive thermal vias and restricted routing.

Reference will now be made to the drawings to describe various aspects of some example embodiments of the invention. The drawings are diagrammatic and schematic representations of such example embodiments, and are not limiting of the present invention, nor are they necessarily drawn to scale.

FIG. 1A is a block diagram illustrating a cross-sectional view of a stack-up of an example AlN substrate 100, arranged in accordance with at least some embodiments described herein. The example AlN substrate 100 may include an AlN thin film 102, a layer of high-frequency polymer 104, and a layer of cladding copper 106. In some embodiments, the high-frequency polymer 104 may include one of polyimide, kapton, amorphous glass, and any other type of suitable high-frequency dielectric material. The cladding copper 106 may include a plating of copper cladded on the high-frequency polymer 104. For example, the high-frequency polymer 104 and the cladding copper 106 may form a commercial copper-plated polyimide layer or roll.

In some embodiments, the AlN thin film 102 may be deposited on the high-frequency polymer 104 using various deposition methods including, but not limited to, reactive magnetron sputtering, pulsed DC magnetic sputtering, plasma vapor deposition, chemical vapor deposition, plasma immersion ion implantation, and any other suitable deposition method.

The AlN thin film 102 may include AlN dielectric material with a higher lateral and/or vertical thermal conductivity than other dielectric materials such as flame retardant four (FR-4) or PRE-PREG materials. In these and other embodiments, the AlN dielectric material may have a thermal conductivity of at least 4 W/m–K. For example, AlN may have a thermal conductivity between 4 W/m–K and 10 W/m–K while a thermal conductivity of regular dielectric material may be between 0.2 W/m–K and 0.3 W/m–K. The AlN thin film 102 may have high dielectric constant (e.g., Dk>6) and low dissipation factor (e.g., Df<0.02 or 0.03) compared to other dielectric materials such as FR-4 or PRE-PREG materials.

The AlN thin film 102 may include nitrogen content with a particular nitrogen concentration level. A higher nitrogen concentration level in the AlN thin film 102 may result in a higher roughness in the AlN thin film 102 (e.g., a roughness in a micron level). The AlN thin film 102 does not include fiber weaves or glass weaves that are commonly included in FR-4 or PRE-PREG materials.

In some embodiments, the AlN substrate 100 of FIG. 1A and/or other AlN substrates described herein may be used to form a core layer, a top layer, a bottom layer, and/or a selected layer of a PCB. The AlN substrate may be bonded with other circuit board layers to form a PCB. For example, a stack-up of the PCB may include: (1) a top layer including differential micro strip pairs; (2) a layer including return path ground; (3) a layer formed by an AlN substrate; (4) one or more additional inner layers for low-to-mid speed routing; (5) another layer formed by another AlN substrate; (6) another layer including return path ground; and (7) a bottom layer including differential micro strip pairs. The return path grounds may be continuous and may cover part of or full area of the substrates. The AlN substrates may cover part of or full area of the substrate. Some example PCBs according to some embodiments are illustrated in and described with reference to FIGS. 7-9.

The AlN substrate 100 of FIG. 1A and/or other AlN substrates described herein may form a flexible foil and may include a thickness between 10 and 100 micrometers, such as a thickness of 15 micrometers, 20 micrometers, or 25 micrometers. In other embodiments, the AlN substrate 100 of FIG. 1A and/or other AlN substrates described herein may include a thickness greater than 100 micrometers or less than 10 micrometers. For example, the AlN substrate 100 may include the AlN thin film 102 with a thickness of 13 micrometers disposed on a polyimide foil with a thickness of 25 micrometers.

Because the AlN substrate 100 of FIG. 1A and/or other AlN substrates described herein may be sufficiently thin (e.g., with a thickness no greater than 30 micrometers such as 15 micrometers, 20 micrometers, or 25 micrometers) and may have high quality microwave capability (e.g., high dielectric constant (e.g., Dk>6) and low dissipation factor (e.g., Df<0.01, 0.02, or 0.03)) compared to glass-reinforced dielectric materials, traces and/or transmission lines with super fine geometries may be deposited on a top side and/or a bottom side of the PCB for massive parallel photonic circuit architectures. For example, an AlN substrate may form a top layer of the PCB, and a top side of the PCB may include traces with a width of about 10 micrometers to 65 micrometers and trace pitches with a width of about 15 micrometers to 200 micrometers. Coplanar micro strip or other micro strip pairs each formed by two traces may include a differential impedance of about 100 ohms. As used herein, the term "about" as applied to a value may indicate a range of ±10% of the stated value. Alternatively or additionally, another AlN substrate may form a bottom layer of the PCB, and a bottom side of the PCB may include traces with a width of about 10 micrometers to 65 micrometers and trace pitches with a width of about 15 micrometers to 200 micrometers. Micro strip pairs each formed by two traces may include a differential impedance of about 100 ohms. In these and other embodiments, the traces and trace pitches may have other dimensions not described herein.

Because of the super fine geometries of the traces and/or transmission lines, the PCB may be configured to operate at a transmission speed of about 25 gigabits per second per channel or a transmission speed higher than 25 gigabits per second per channel (e.g., 28 gigabits per second per channel, 50 gigabits per second per channel). It may be easy to laser drill and/or cut the AlN substrate. The AlN substrate may be optically transparent and may be used to form various photonic waveguide structures along with flip chip active photonic devices. Thus, chip-to-chip optical communication may be routed through the AlN based waveguide on board the substrate. An example waveguide formed by AlN is illustrated in FIGS. 11A and 11B. Although some embodiments are described as facilitating or involving transmission speeds of 25 gigabits per second or higher, the embodiments may also be used with transmission speeds lower than 25 gigabits per second.

Figure 1B:
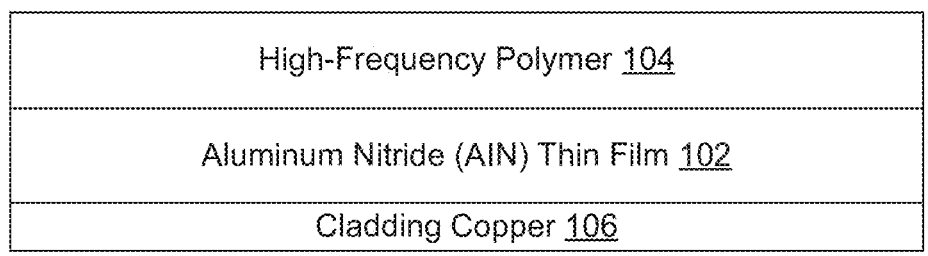

FIG. 1B is a block diagram illustrating a cross-sectional view of a stack-up of another example AlN substrate 150, arranged in accordance with at least some embodiments described herein. Compared to the AlN substrate 100 of FIG. 1A, the high-frequency polymer 104 of the AlN substrate 150 may be disposed on top of the AlN thin film 102 so that the AlN thin film 102 may be disposed between the cladding copper 106 and the high-frequency polymer 104.

Figure 2:
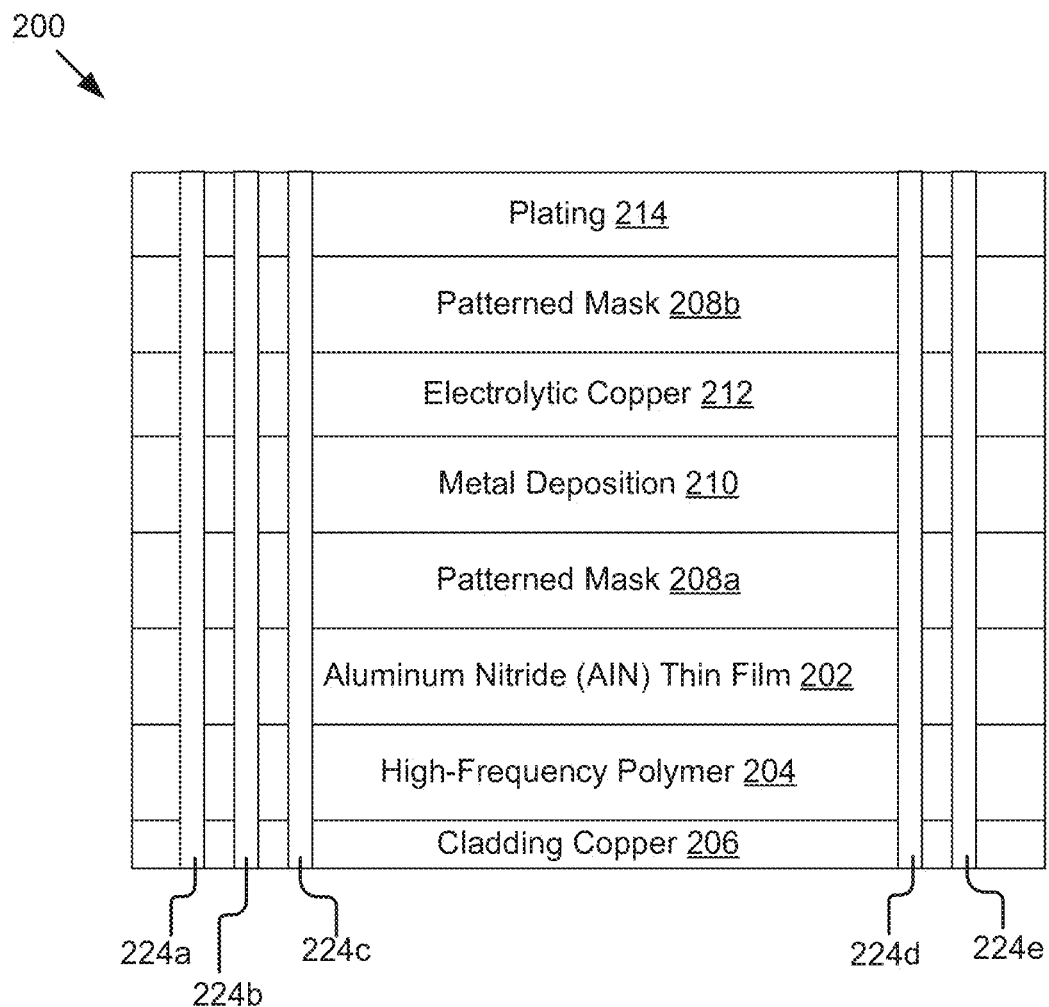

FIG. 2 is a block diagram illustrating a cross-sectional view of a stack-up of an example AlN substrate 200 with metallization, arranged in accordance with at least some embodiments described herein. The AlN substrate 200 may be metallized through deposition techniques, yielding smooth and even metal patterns and/or traces. The metals or metal alloys used in the metallization of the AlN substrate may include, but are not limited to, Ti/Ti SiN/Au, Ti/Pt/Au, Ti—W/Au, Cr—Cu, Cr—Au, Ti—W/Ni—Cu, TaN—Cr—Au, Ti—Pd—Au, Mo—Mn, electrodes copper, and other suitable metals or metal alloys.

The example AlN substrate 200 illustrated in FIG. 2 may include one or more of a layer of cladding copper 206, a layer of high-frequency polymer 204, an AlN thin film 202, a first patterned mask 208a, a layer of metal deposition 210, a layer of electrolytic copper 212, a second patterned mask 208b, and a plating 214. The cladding copper 206, the high-frequency polymer 204, and the AlN thin film 202 may be similar to the cladding copper 106, the high-frequency polymer 104, and the AlN thin film 102 of FIG. 1A, respectively. The description for similar elements already described above will not be repeated here.

In some embodiments, the metal deposition 210 may include one of Ni-chrome-electro-vacuum deposition, Tin palladium colloid electro less deposition, Ni—P electro less deposition, and any other suitable type of metal deposition. The electrolytic copper 212 may be plated over a Ni-chrome patterned surface if the metal deposition 210 includes Ni-chrome-electro-vacuum deposition. Similarly, the electrolytic copper 212 may be plated over a Tin palladium colloid patterned surface if the metal deposition 210 includes Tin palladium colloid electro less deposition. The electrolytic copper 212 may be plated over a Ni—P patterned surface if the metal deposition 210 includes Ni—P electro less deposition.

The plating 214 may include electro less nickel electro less palladium immersion gold (ENEPIG) or any other suitable type of plating. In some embodiments, the plating 214 may include palladium with a sufficient thickness that enables a PCB including the AlN substrate 200 to pass corrosion tests such as a mixed flowing gas test. For example, a thickness of the palladium used herein may be about 0.5 micrometers or more, rather than a thickness between 0.03 micrometers and 0.3 micrometers used in some other PCBs.

One or more vias 224a, 224b, 224c, 224d, and 224e may be drilled in the AlN substrate 200 using laser or other hole drilling techniques. The vias 224a-224e may include copper filled vias. The vias 224a-224e each may have a diameter greater than 25 micrometers. In these and other embodiments, the vias 224a-224e may have other dimensions different from those described herein. Although the vias 224a-224e are illustrated as through holes (or through vias) in the AlN substrate 200, the vias 224a-224e may include blind vias and/or buried vias in some embodiments. Although five vias 224a-224e are illustrated in FIG. 2, the AlN substrate 200 may include any number of vias in some embodiments.

In some embodiments, the AlN substrate 200 of FIG. 2 and/or other AlN substrates described herein may be constructed by performing operations including one or more of the following: (1) applying a mask pattern to an AlN thin film for deposition of an adhesion layer; (2) performing an etching process to etch away excess adhesion layer metal; (3) masking pattern for copper deposition (including fiducial marks and/or alignment holes); (4) drilling holes for via placement using laser or other drilling techniques; (5) depositing electrolytic copper onto the adhesion layer; (6) making pattern for copper etch; and (7) performing deposition of ENEPIG. In these and other embodiments, different and/or additional operations may be performed to construct the AlN substrate.

Figure 3:
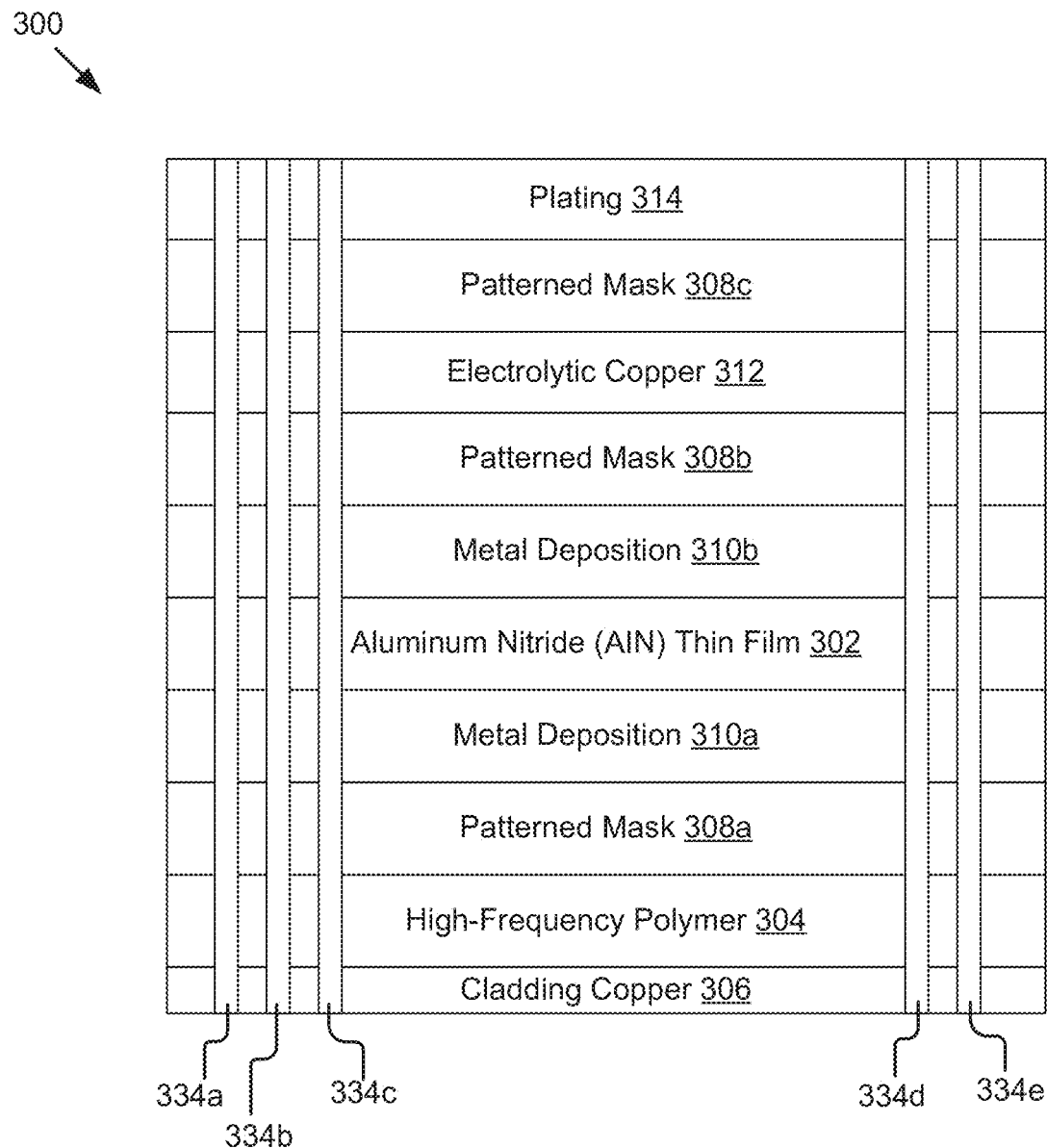

FIG. 3 is a block diagram illustrating a cross-sectional view of a stack-up of another example AlN substrate 300 with metallization, arranged in accordance with at least some embodiments described herein. The metallization of the AlN substrate 300 may be performed using deposition techniques as described herein. The AlN substrate 300 may include one or more of a plating 314, a patterned mask 308c, electrolytic copper 312, a patterned mask 308b, metal deposition 310b, an AlN thin film 302, metal deposition 310a, a patterned mask 308a, a layer of high-frequency polymer 304, and a layer of cladding copper 306. Description for similar elements already described above will not be repeated here.

Five vias 334a, 334b, 334c, 334d, and 334e are illustrated by way of example in FIG. 3. The vias 334a-334e may include copper filled vias. Although the vias 334a-334e are illustrated as through holes in the AlN substrate 300, the vias 334a-334e may include blind vias and/or buried vias in some embodiments. Although five vias 334a-334e are illustrated in FIG. 3, the AlN substrate 300 may more generally include any number of vias.

Figure 4:
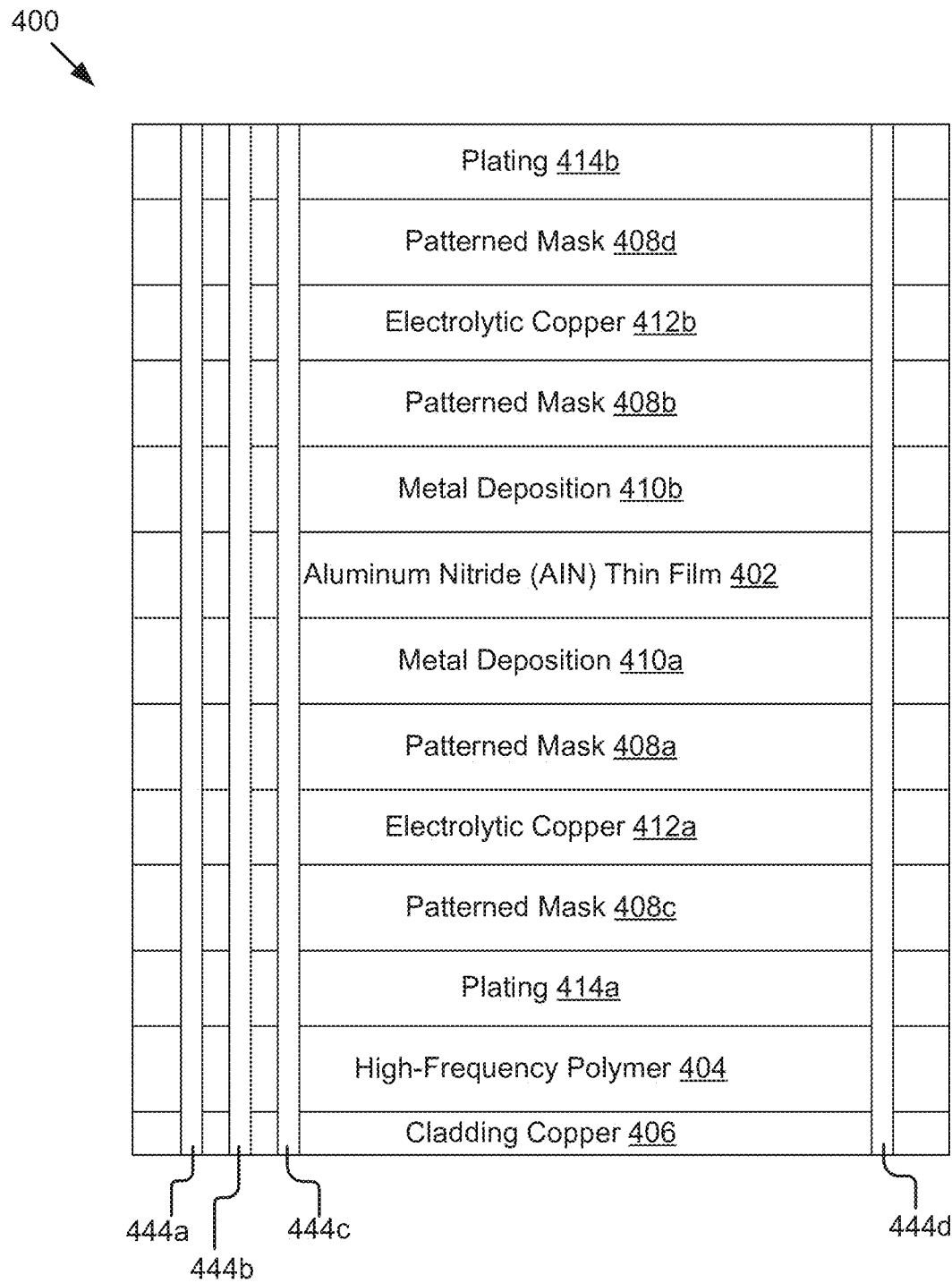

FIG. 4 is a block diagram illustrating a cross-sectional view of a stack-up of yet another example AlN substrate 400 with metallization, arranged in accordance with at least some embodiments described herein. The metallization of the AlN substrate 400 may be performed using deposition techniques described herein. The AlN substrate 400 may include one or more of a plating 414b, a patterned mask 408d, electrolytic copper 412b, a patterned mask 408b, metal deposition 410b, an AlN thin film 402, metal deposition 410a, a patterned mask 408a, electrolytic copper 412a, a patterned mask 408c, a plating 414a, a layer of high-frequency polymer 404, and a layer of cladding copper 406. Description for similar elements already described above will not be repeated here. Four vias 444a, 444b, 444c, and 444d are illustrated by way of example in FIG. 4. The vias 444a-444d may include copper filled vias. More generally, the AlN substrate 400 may include any number and/or any types of vias.

Figure 5:
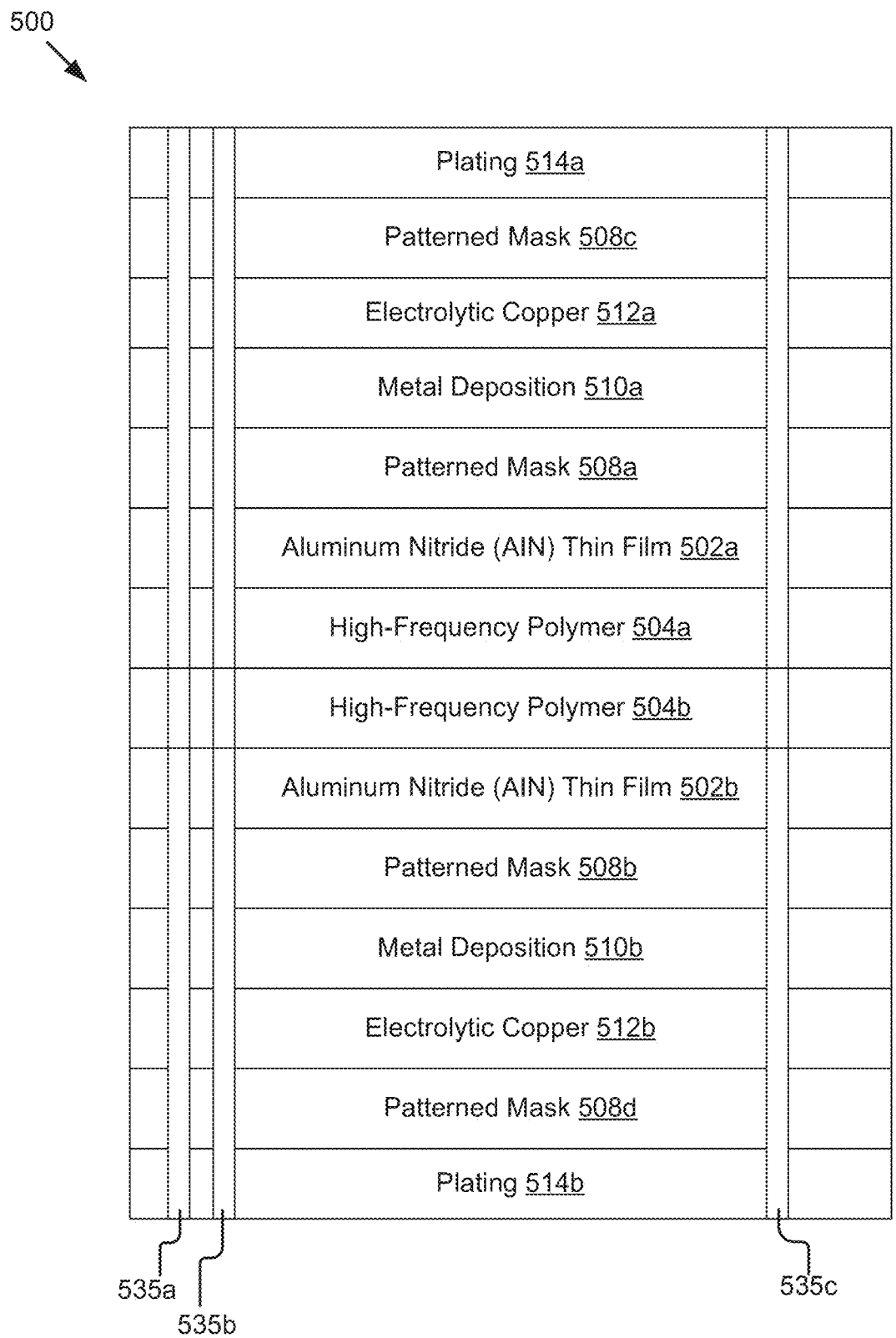

FIG. 5 is a block diagram illustrating a cross-sectional view of a stack-up of an example double sided AlN substrate 500 with metallization, arranged in accordance with at least some embodiments described herein. The metallization of the AlN substrate 500 may be performed using deposition techniques described herein. The AlN substrate 500 may include one or more of a plating 514a, a patterned mask 508c, electrolytic copper 512a, metal deposition 510a, a patterned mask 508a, an AlN thin film 502a, a first layer of high-frequency polymer 504a, a second layer of high-frequency polymer 504b, an AlN thin film 502b, a patterned mask 508b, metal deposition 510b, electrolytic copper 512b, a patterned mask 508d, and a plating 514b. The first layer of high-frequency polymer 504a and the second layer of high-frequency polymer 504b may act as bonding layers to bond the AlN thin films 502a and 502b together. Description for similar elements already described above will not be repeated here. Three vias 535a, 535b, and 535c are illustrated by way of example in FIG. 5. The vias 535a-535c may include copper filled vias. More generally, the AlN substrate 500 may include any number and/or any types of vias.

Figure 6A:
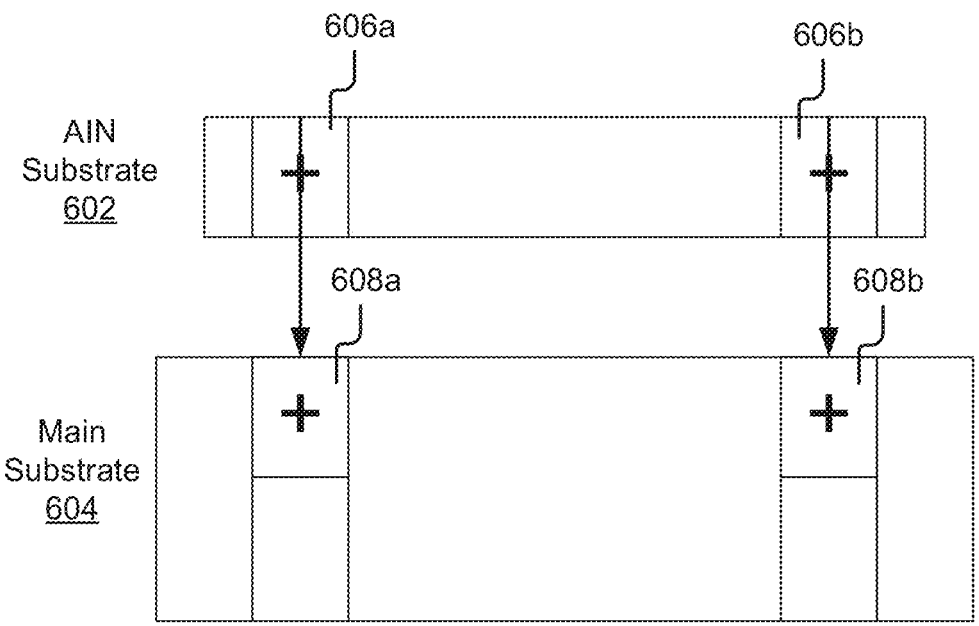
FIG. 6A is a graphical representation illustrating a side view of an alignment of an example AlN substrate and an example main substrate.

FIG. 6A is a graphical representation illustrating a side view of an alignment of an example AlN substrate 602 and an example main substrate 604, arranged in accordance with at least some embodiments described herein. The AlN substrate 602 may include any of the AlN substrates 100, 150, 200, 300, 400, and/or 500 illustrated in FIGS. 1A-5. The AlN substrate 602 may include fiducial markers such as fiducial holes 606a and 606b. The main substrate 604 may include one or more circuit board layers such as an internal layer, a bottom layer, a PREPREG layer, and/or a core layer. The main substrate 604 may include fiducial markers such as fiducial holes 608a and 608b. The AlN substrate 602 may be aligned with the main substrate 604 using the fiducial holes. For example, the fiducial hole 606a may be aligned to the fiducial hole 608a, and the fiducial hole 606b may be aligned to the fiducial hole 608b. In some embodiments, a micrometer-scale alignment resolution may be achieved. In these and other embodiments, the AlN substrate 602 may be aligned to the main substrate 604 using other approaches instead of or in addition to the fiducial alignment.

The AlN substrate 602 may be bonded with the main substrate 604 to form a PCB such as a rigid board or a flexible board. For example, the AlN substrate 602 may be bonded with the main substrate 604 so that the AlN substrate 602 may form a top layer of the PCB while the main substrate 604 may form a remainder of the PCB. In these and other embodiments, the AlN substrate 602 may form any other layer of the PCB such as a bottom layer, a core layer, or other selected layer.

Figure 6B:
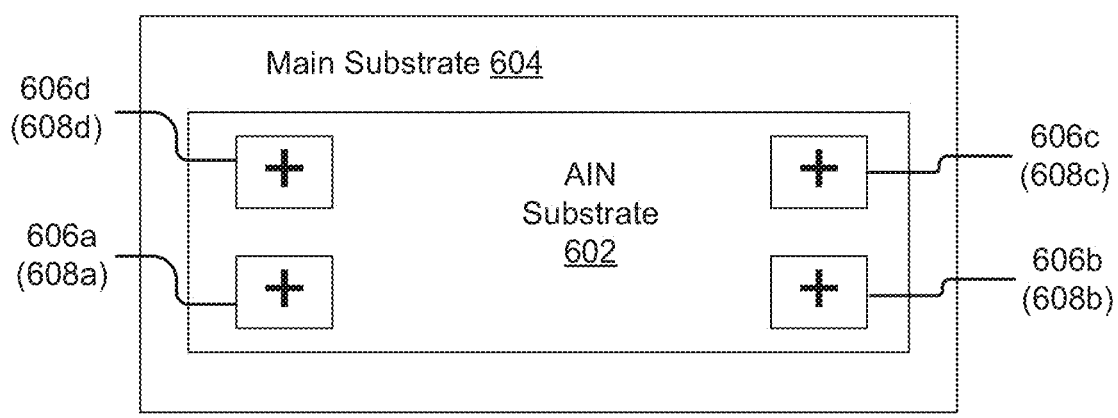
FIG. 6B is a graphical representation illustrating a top view of the alignment of the example AlN substrate and the example main substrate of FIG. 6A.

FIG. 6B is a graphical representation illustrating a top view of the alignment of the example AlN substrate 602 and the example main substrate 604 of FIG. 6A, arranged in accordance with at least some embodiments described herein. In FIG. 6B, the fiducial hole 606a of the AlN substrate 602 may be aligned with the fiducial hole 608a of the main substrate 604. The fiducial hole 606b of the AlN substrate 602 may be aligned with the fiducial hole 608b of the main substrate 604. A fiducial hole 606c of the AlN substrate 602 may be aligned with a fiducial hole 608c of the main substrate 604. A fiducial hole 606d of the AlN substrate 602 may be aligned with a fiducial hole 608d of the main substrate 604. Although the AlN substrate 602 and the main substrate 604 are described as including four fiducial holes 606d-606d or 608a-608d each, more generally, each of the AlN substrate 602 and the main substrate 604 may include two or more fiducial holes.

Figure 7:
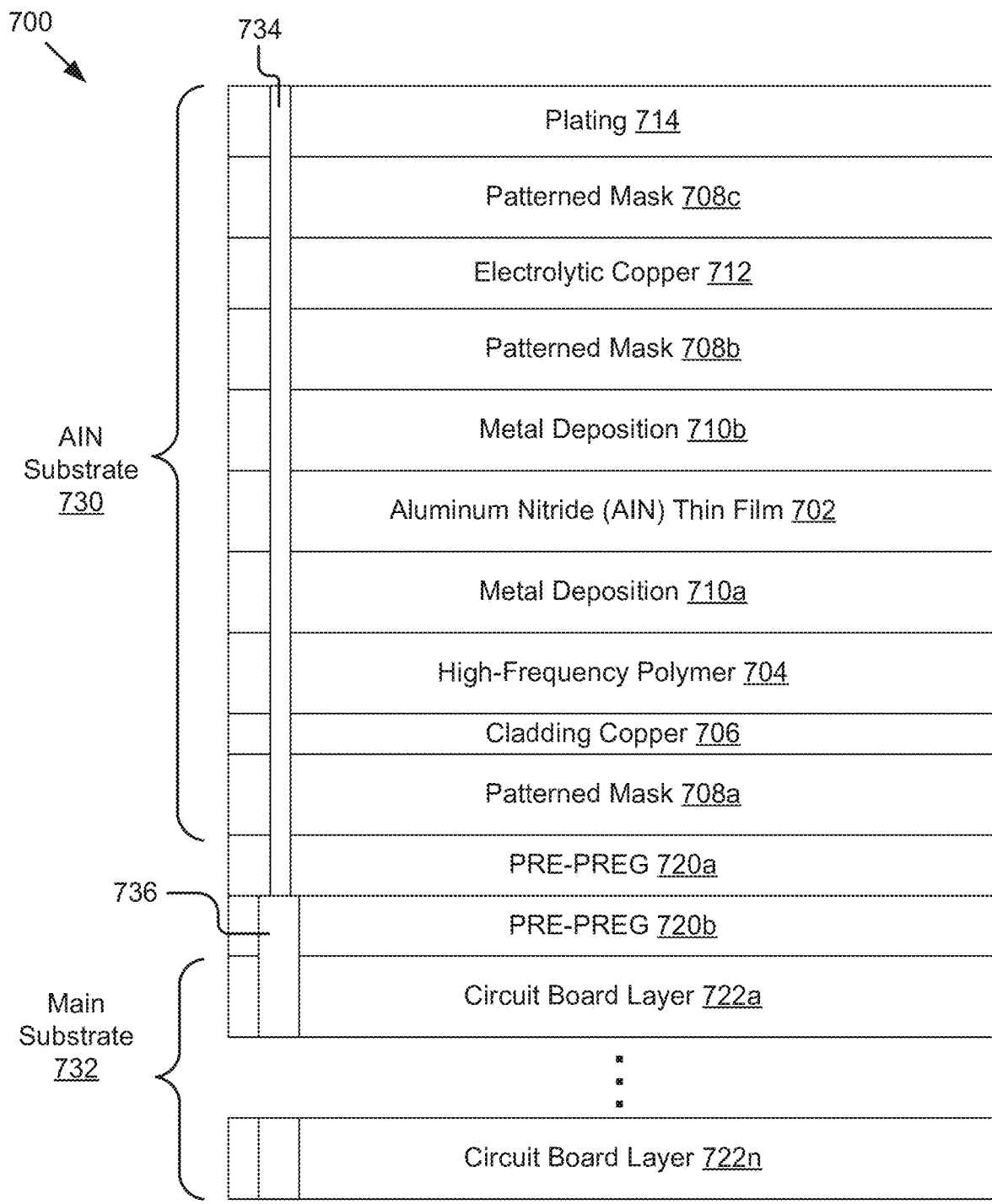
FIG. 7 is a block diagram illustrating a cross-sectional view of a stack-up of an example printed circuit board including an example AlN substrate and an example main substrate bonded using pre-impregnated composite film materials (PRE-PREG)

FIG. 7 is a block diagram illustrating a cross-sectional view of a stack-up of an example PCB 700 including an example AlN substrate 730 and an example main substrate 732 bonded together using PRE-PREG, arranged in accordance with at least some embodiments described herein. The AlN substrate 730 may include one or more of a plating 714, a patterned mask 708c, electrolytic copper 712, a patterned mask 708b, metal deposition 710b, an AlN thin film 702, metal deposition 710a, a layer of high-frequency polymer 704, a layer of cladding copper 706, and a patterned mask 708a. Description for similar elements already described above will not be repeated here. In some embodiments, the AlN substrate 730 may include any of the AlN substrates 100, 150, 200, 300, 400, 500 illustrated in FIGS. 1A-5. The main substrate 732 may include one or more circuit board layers 722a-722n, such as a core (FR-4 or Megtron VI), a layer of PRE-PREG, and/or a bottom layer.

In these and other embodiments, a layer of PRE-PREG 720a may be included in the AlN substrate 730. A layer of PRE-PREG 720b may be included in the main substrate 732. The main substrate 732 may be bonded with the AlN substrate 730 using the PRE-PREGs 720a and 720b through an adhesion process performed after an etch process. A via 734 in the AlN substrate 730 may be thermally coupled with a via 736 in the main substrate 732. The vias 734 and 746 may include copper filled vias. Although one via 734 in the AlN substrate 730 and one via 736 in the main substrate 732 are illustrated in FIG. 7, more generally the AlN substrate 730 may include one or more vias 734 thermally coupled to one or more corresponding vias 736 in the main substrate 732.

Figure 8:
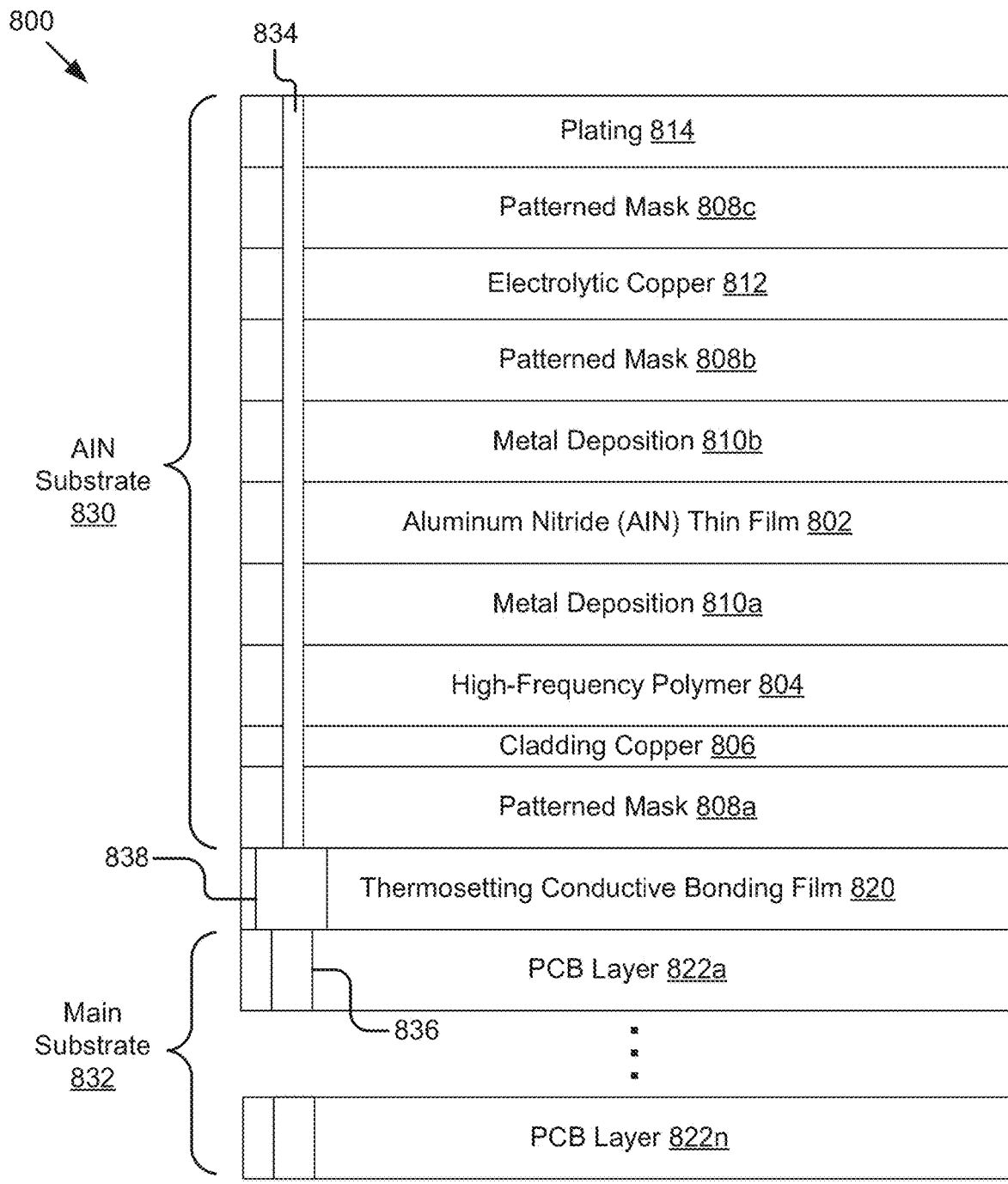
FIG. 8 is a block diagram illustrating a cross-sectional view of a stack-up of another example printed circuit board including an example AlN substrate and an example main substrate bonded using a thermosetting conductive bonding film.

FIG. 8 is a block diagram illustrating a cross-sectional view of a stack-up of another example PCB 800 including an example AlN substrate 830 and an example main substrate 832 bonded using a thermosetting conductive bonding film 820, arranged in accordance with at least some embodiments described herein.

The AlN substrate 830 may include one or more of a plating 814, a patterned mask 808c, electrolytic copper 812, a patterned mask 808b, metal deposition 810b, an AlN thin film 802, metal deposition 810a, a layer of high-frequency polymer 804, a layer of cladding copper 806, and a patterned mask 808a. Description for similar elements already described above will not be repeated here. In some embodiments, the AlN substrate 830 may include any of the AlN substrates 100, 150, 200, 300, 400, 500 illustrated in FIGS. 1A-5.

The main substrate 832 may include one or more circuit board layers 822a-822n, such as a top layer, a core (FR-4 or Megtron VI), a layer of PRE-PREG, and/or a bottom layer. The main substrate 832 may be bonded with the AlN substrate 830 using the thermosetting conductive bonding film 820. In some embodiments, the thermosetting conductive bonding film 820 may include CBF-300 or another suitable type of bonding film. The thermosetting conductive bonding film 820 may include a conductive path 838 for thermally coupling a via 834 in the AlN substrate 830 to a via 836 in the main substrate 832. The vias 834 and 846 may include copper filled vias. Although one via 834 in the AlN substrate 830, one via 836 in the main substrate 832, and one conductive path 838 in the thermosetting conductive bonding film 820 are illustrated in FIG. 8, more generally the AlN substrate 830 may include one or more vias 834 thermally coupled to one or more corresponding vias 836 in the main substrate 832 using one or more conductive paths 838 in the thermosetting conductive bonding film 820.

Figure 9:
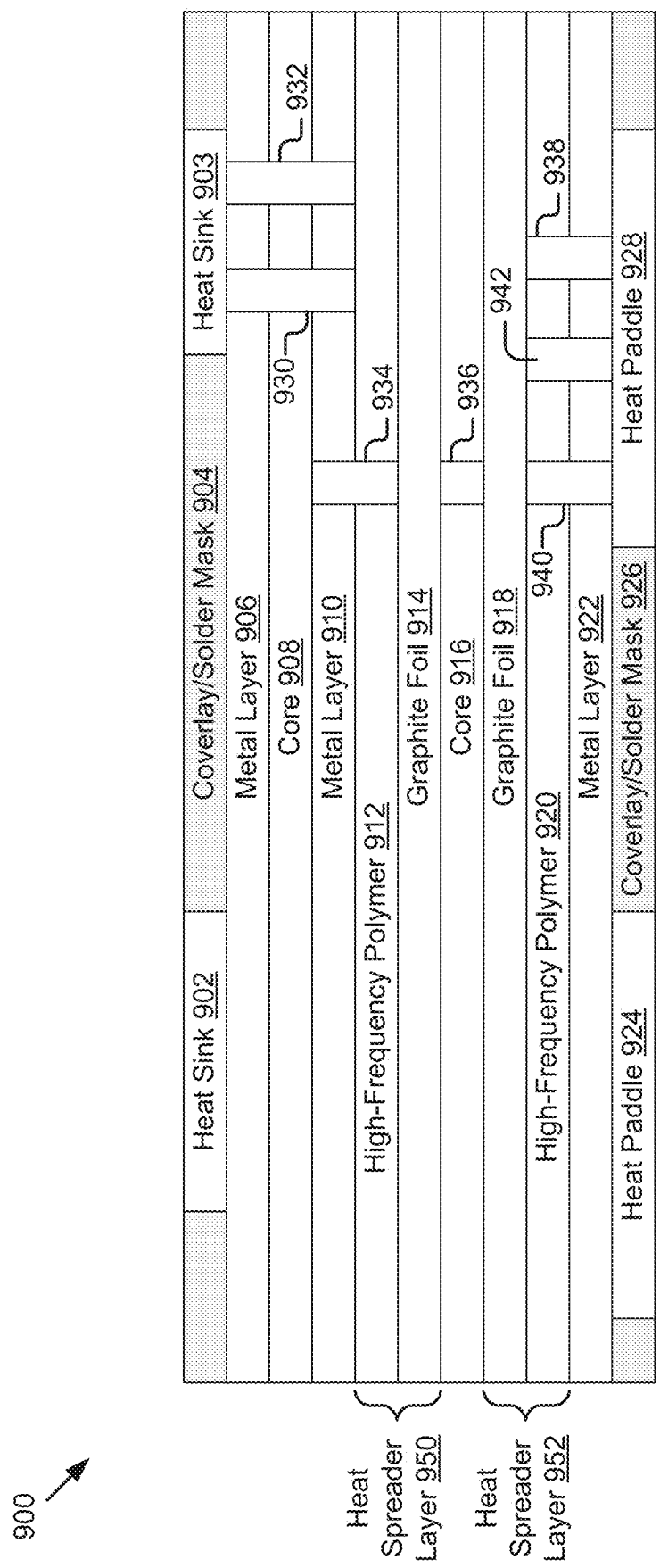
FIG. 9 is a block diagram illustrating a cross-sectional view of a stack-up of yet another example printed circuit board.

FIG. 9 is a block diagram illustrating a cross-sectional view of a stack up of yet another example PCB 900, arranged in accordance with at least some embodiments described herein. The PCB 900 may include a rigid board or a flexible board. The PCB 900 may include a heat sink 902, a coverlay/solder mask 904, another heat sink 903, a metal layer 906, a core 908, a metal layer 910, a layer of high-frequency polymer 912, a graphite foil 914, a core 916, another graphite foil 918, another layer of high-frequency polymer 920, a metal layer 922, a heat paddle 924, another coverlay/solder mask 926, another heat paddle 928, and other suitable elements. In these and other embodiments, the PCB 900 may include vias 930, 932, 934, 936, 938, 940, and 942 (collectively "vias 930-942"). Although seven vias 930-942 are illustrated as blind vias in FIG. 9, more generally the PCB 900 may include any number of blind vias, through vias, and/or buried vias.

In some embodiments, the core 908 may include aluminum nitride. Alternatively or additionally, the core 916 may include aluminum nitride. The layers of high-frequency polymer 912 and 920 may include polyimide, kapton, or another suitable type of dielectric material coated with silicon nitride (SiN), silicon oxide (SiOx), amorphous silicon (a-Si), or another suitable type of coating material, with a coating thickness of about 100 micrometers. The graphite foils 914 and 918 may include a thermal conductivity no less than 300 W/m–K in the x-y directions and 15 W/m–K in the z direction. The graphite foils 914 and 918 may thus be highly thermally conductive compared to the AlN. In some embodiments, the layer of high-frequency polymer 912 and the graphite foil 914 may form a heat spreader layer 950. Alternatively or additionally, the layer of high-frequency polymer 920 and the graphite foil 918 may form another heat spreader layer 952. In these and other embodiments, the cores 908 and 916 including AlN may also act as heat spreader layers which may allow lateral heat flow.

In some embodiments, active loads (e.g., active integrated circuits) may be mounted on the heat sinks 902 and 903. Heat generated by the active loads may be drawn away from the heat sinks 902 and 903 to the heat spreader layers 950 and 952 and also to the heat paddles 924 and 928 through the vias 930-942. Heat extraction described herein may be spread across the PCB 900 using the heat spreader layers 950 and 952, the cores 908 and 916, and/or the metal layers 906 and 922, rather than being localized directly underneath the active load. Lateral heat flow on the heat spreader layers 950 and 952 may be beneficial for heat removal and/or heat distribution.

With combined reference to FIGS. 1A-10 described above, some embodiments described herein may include a semi-rigid or flexible double-sided multi-layer PCB that may be sequentially laminated and suitable for wire bonding and surface mount assembly. The PCB may include: an AlN substrate that includes an AlN thin film and a layer of high-frequency polymer (e.g., polyimide, kapton, or another suitable type of materials) as a carrier substrate of the AlN thin film; and a main substrate aligned to and bonded with the AlN substrate. The main substrate may include one or more additional layers of the PCB. The AlN substrate may be configured to form one of a top layer, a bottom layer, and a core layer of the PCB.

The AlN substrate may be configured as a heat spreader that laterally spreads out heat from a heat sink on the PCB so that a thermal dissipation path may be formed to be parallel with a signal path on the PCB. For example, a signal path on the PCB may be parallel with an x-y plane (e.g., a plane of the PCB or the AlN substrate), and heat may be laterally spread out across the x-y plane of the AlN substrate in addition to a vertical direction (z direction) spread. The heat dissipation is not localized directly underneath the active load. Different from a copper coin which may wipe out trace routing space in an area (e.g., due to construction of inter-layer vias which obstruct routing space in subsequent layers), the heat dissipation of the AlN substrate does not create holes inside the PCB and therefore avoids loss of routing space within the PCB.

The PCB further includes a thermosetting conductive bonding film that bonds the AlN substrate to the main substrate. The AlN substrate may include a first via, the main substrate may include a second via, and the thermosetting conductive bonding film may include a conductive path that may electrically and/or thermally couple the first via with the second via. The conductive path may be electrically conductive only in a vertical direction (z direction), allowing via transitioning from the first via to the second via.

In some embodiments, the AlN thin film may include nitrogen content with a particular nitrogen concentration level and may be free of fiber weave materials or glass weave materials. The AlN substrate may include a low loss tangent that is lower than that of fiber weave materials. For example, the loss tangent of the AlN substrate may be lower than 0.04. The AlN substrate may include a thickness between 1 micrometer and 100 micrometers.

In some embodiments, the AlN substrate may form a top layer of the PCB with a thickness no greater than 150 micrometers, and a top side of the PCB may include traces with a width between about 10 micrometers and about 65 micrometers and trace pitches with a width between about 15 micrometers and 200 micrometers.

The AlN substrate may include a metallization of one of nickel (Ni)-based deposition, palladium-based deposition, silver-based deposition, Ni-chrome-electro-vacuum deposition, Tin palladium colloid electro less deposition, and Ni—P electro less deposition. The silver-based metallization may be applied in high frequency where skin depth issues prevent usage of nickel. The palladium-based metallization may be applied in wire bonding or other situations to improve durability.

Figure 10:
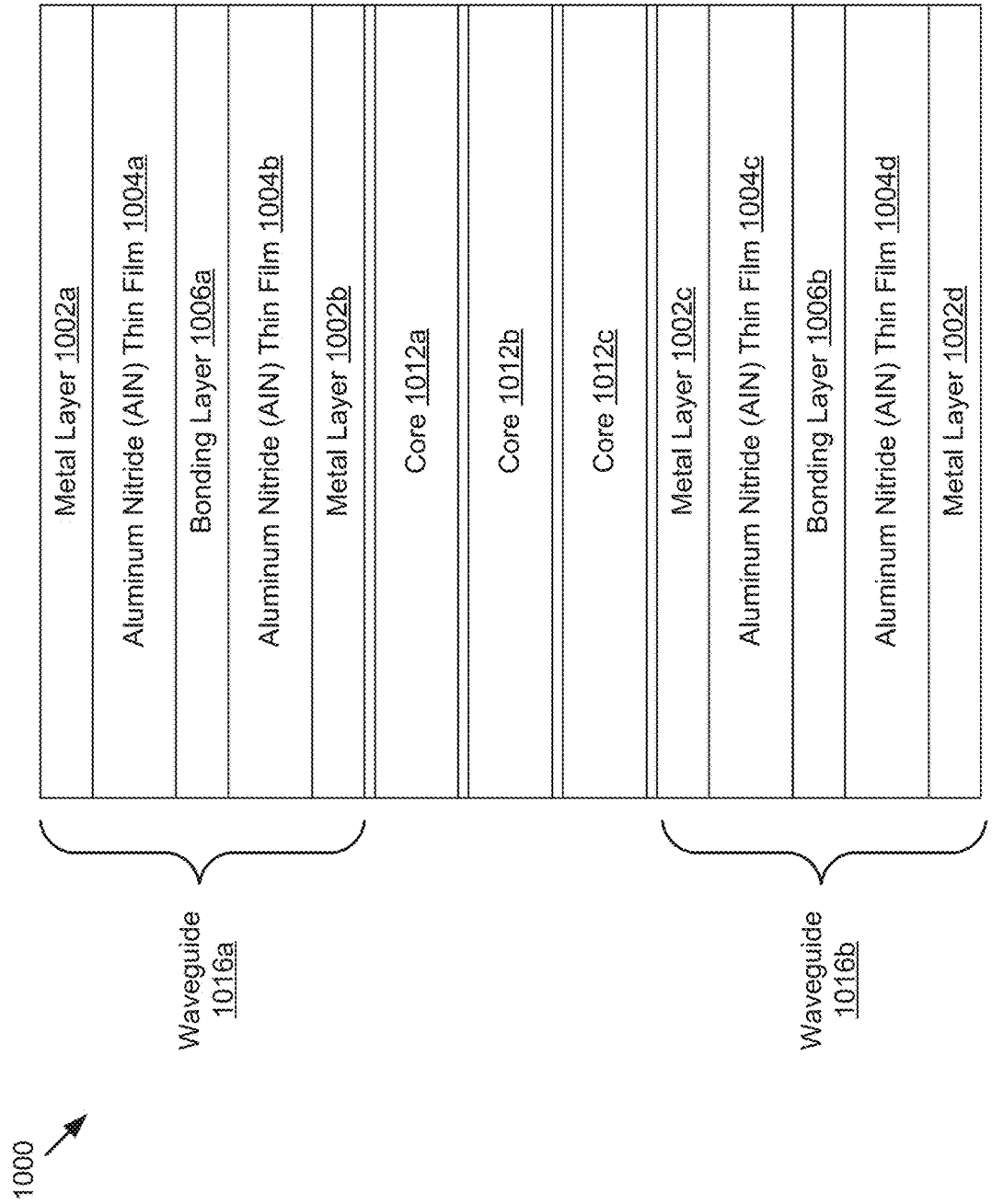
FIG. 10 is a block diagram illustrating a stack-up of example wave guides in an example printed circuit board.

FIG. 10 is a block diagram illustrating a stack-up of example wave guides in an example PCB 1000, arranged in accordance with at least some embodiments described herein. The example PCB 1000 may include, among others, a waveguide 1016a, one or more cores 1012, including cores 1012a, 1012b, and 1012c, and another waveguide 1016b. The waveguide 1016a may include a metal layer 1002a, an AlN thin film 1004a, a bonding layer 1006a, another AlN thin film 1004b, and another metal layer 1002b. The waveguide 1016a may form a top layer of the PCB. The bonding layer 1006a may include polyimide, kapton, or another suitable type of bonding material. The cores 1012a, 1012b, and 1012c may include FR-4, Megtron VI, or another suitable type of cores. The waveguide 1016b may include a metal layer 1002c, an AlN thin film 1004c, a bonding layer 1006b, another AlN thin film 1004d, and another metal layer 1002d. The waveguide 1016b may form a bottom layer of the PCB. The bonding layer 1006b may include polyimide, kapton, or another suitable type of bonding material. Optical communication routing may be implemented through the waveguide 1016a and/or the waveguide 1016b.

FIG. 11A is a block diagram illustrating a top view of an example chip-to-chip optical communication routing through a waveguide 1100, arranged in accordance with at least some embodiments described herein. The waveguide 1100 may be formed by an AlN thin film 1106 surrounded by dielectric material 1104 having a permittivity (or an index of refraction) lower than the aluminum nitride. Example dielectric material 1104 may include metal, air, or another type of dielectric material with an index of refraction lower than the aluminum nitride. The waveguide 1100 may route optical communications between a chip 1108 and another chip 1110 on the PCB 1102. In some embodiments, the PCB 1102 may include a rigid board or a flexible board.

In some embodiments, both of the AlN thin film 1106 and the dielectric material 1104 may include aluminum nitride. However, the AlN thin film 1106 may include first nitrogen content with a higher concentration than second nitrogen content included in the dielectric material 104 so that the AlN thin film 1106 may have a higher index of refraction than the dielectric material 104. Thus, a waveguide may be formed by the AlN thin film 1106 and the dielectric material 1104 so that a light beam may be guided to propagate through the AlN thin film 1106.

FIG. 11B is a block diagram illustrating a side view of the example chip-to-chip optical communication routing through the waveguide 1100 of FIG. 11A, arranged in accordance with at least some embodiments described herein.

Figure 12A:
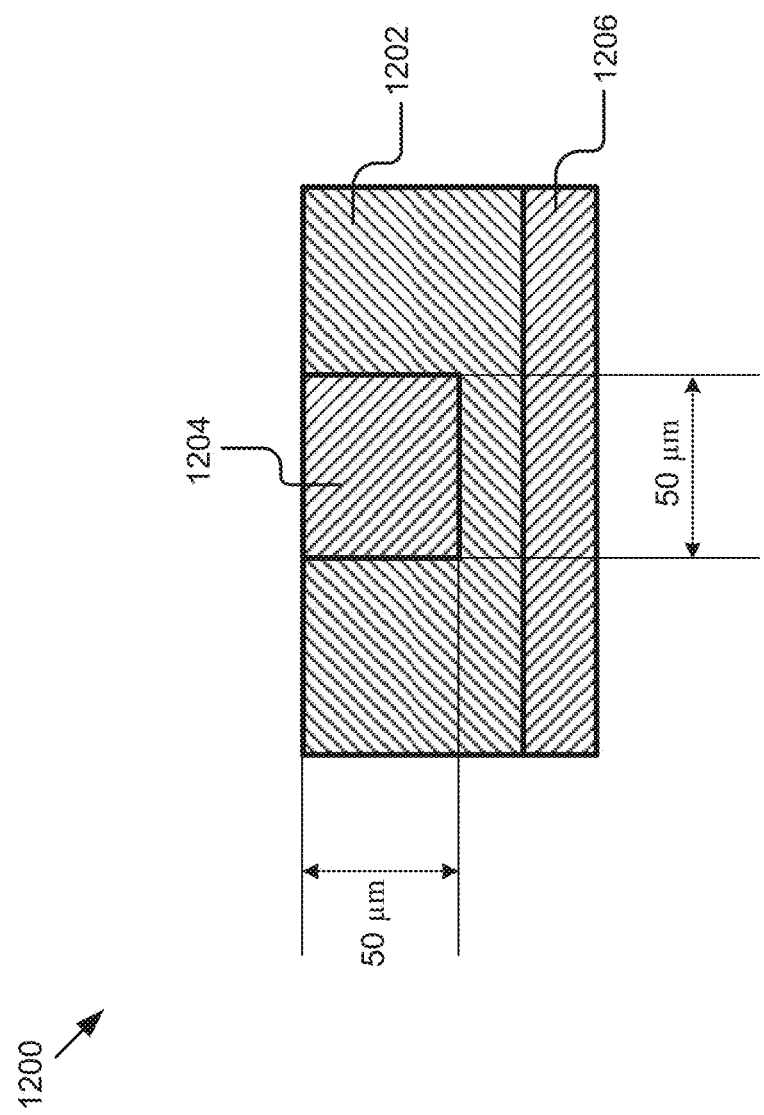
FIG. 12A is a block diagram illustrating a cross-sectional view of a waveguide formed by an example AlN substrate.

FIG. 12A is a block diagram illustrating a cross-sectional view of a waveguide 1200 formed by an example AlN substrate, arranged in accordance with at least some embodiments described herein. The AlN substrate may include a layer of high-frequency polymer 1206 (e.g., polyimide, kapton, or other suitable materials), a first AlN thin film 1202 disposed on top of the high-frequency polymer 1206, and a second AlN thin film 1204 embedded in the first AlN thin film 1202.

The first AlN thin film 1202 may include nitrogen content with a first concentration level, and the second AlN thin film 1204 may include nitrogen content with a second concentration level that may be higher than the first concentration level. As a result, the second AlN thin film 1204 may have a higher index of refraction than the first AlN thin film 1202 so that the waveguide 1200 (e.g., a trench waveguide) may be formed by the second AlN thin film 1204 and the first AlN thin film 1206. A light beam may be guided through the waveguide through the second AlN thin film 1204. For example, the first AlN thin film 1202 may include 30% of nitrogen (or another suitable level of nitrogen) with an index of refraction of 1.575 (or another suitable index of refraction). The second AlN thin film 1204 may include 80% of nitrogen (or another suitable level of nitrogen) with an index of refraction of 1.725 (or another suitable index of refraction). The cross section of the second thin film 1204 may have a dimension of 50 micrometers by 50 micrometers or of another suitable dimension.

Figure 12B:
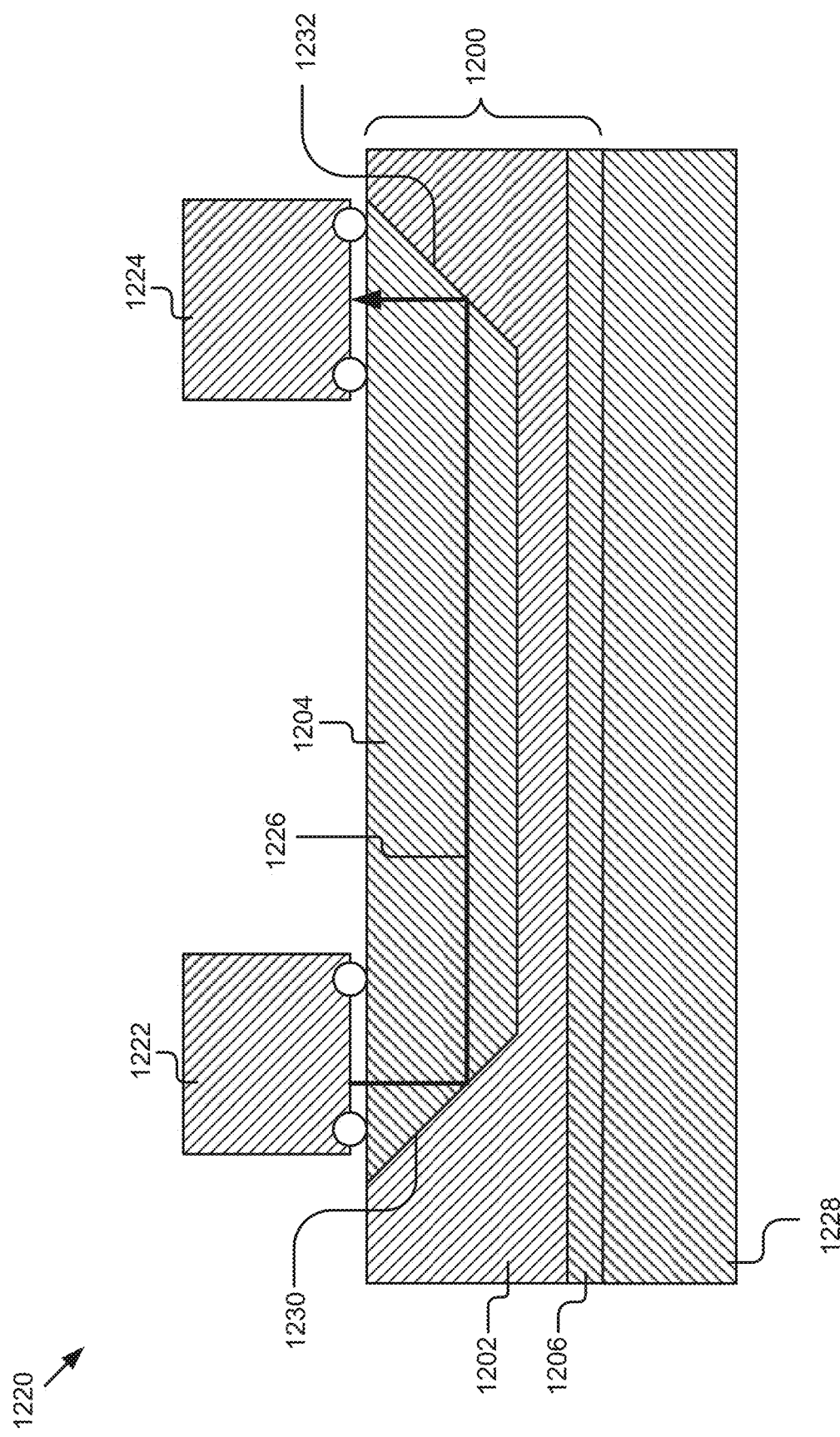
FIG. 12B is a block diagram illustrating another cross-sectional view of the waveguide of FIG. 12A that routes a light beam from a laser to a photodiode.

FIG. 12B is a block diagram illustrating another cross-sectional view of the waveguide 1200 of FIG. 12A that routes a light beam 1226 from a laser 1222 to a photodiode 1224, arranged in accordance with at least some embodiments described herein. The waveguide 1200 formed by the AlN substrate of FIG. 12A may be disposed on top of a PCB substrate 1228 (e.g., a main substrate illustrated in FIGS. 6A-8). As illustrated in FIG. 12B, the first AlN thin film 1202 and the second AlN thin film 1204 with different indices of refraction may create reflective surfaces 1230 and 1232 for the light beam 1226.

The laser 1222 may include a vertical-cavity surface-emitting laser (VCSEL) or another suitable laser that may emit the light beam 1226. The light beam 1226 may travel to the second AlN thin film 1204 and then may be reflected by the reflective surface 1230 to change its propagation direction. The light beam 1226 may be guided through the second AlN thin film 1204 and reflected by the reflective surface 1232 to propagate to the photodiode 1224.

Figure 12C:
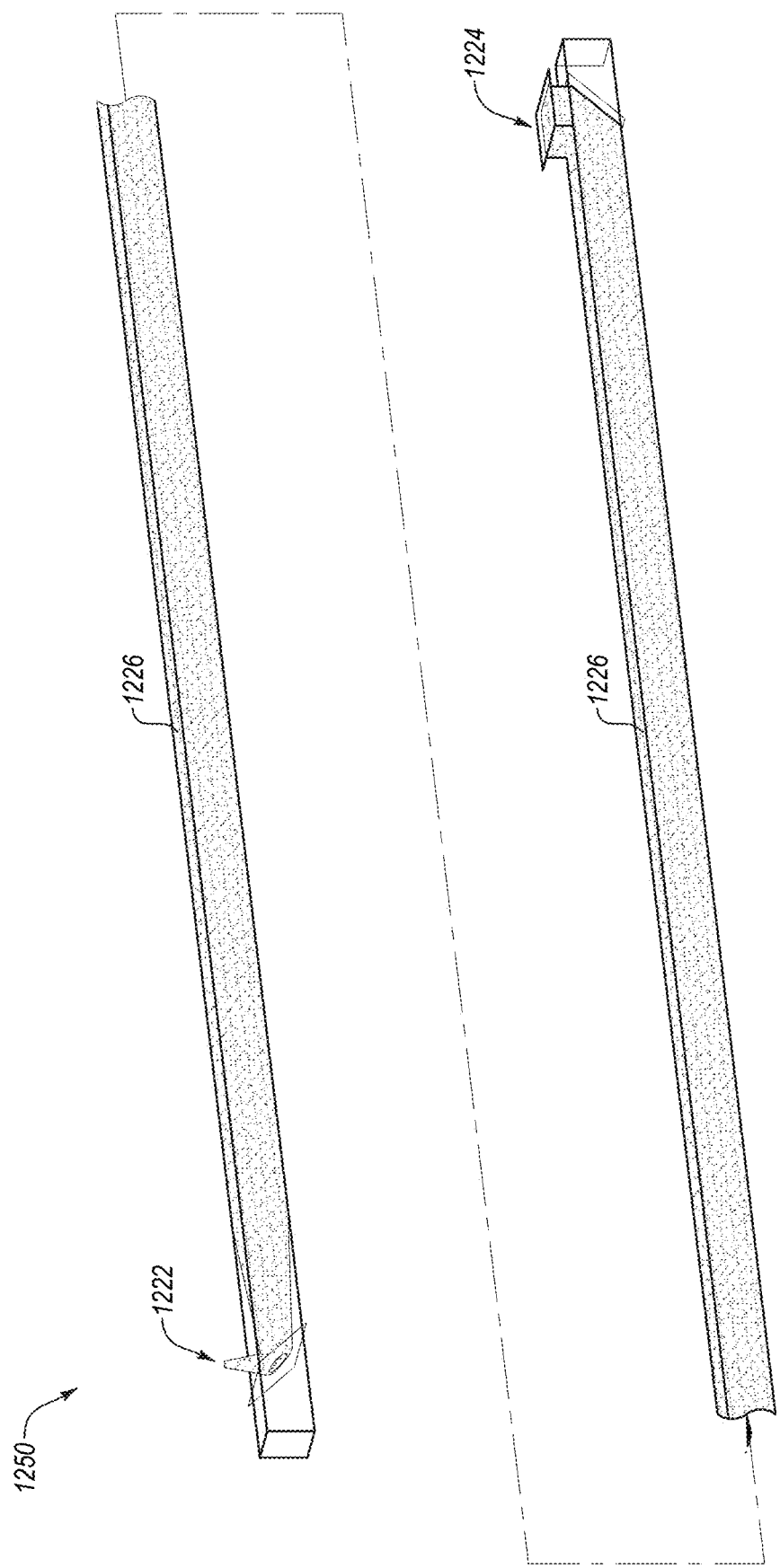
FIG. 12C is a graphic representation illustrating a simulation of light transmission through the waveguide of FIGS. 12A and 12B.

FIG. 12C is a graphic representation 1250 illustrating a simulation of light transmission through the waveguide 1200 of FIGS. 12A and 12B, arranged in accordance with at least some embodiments described herein. The light beam 1226 emitted from the laser 1222 of FIG. 12B may be reflected to propagate through the waveguide 1200 of FIGS. 12A and 12B, and may then be reflected to propagate to the photodiode 1224 of FIG. 12B.

Figure 13:
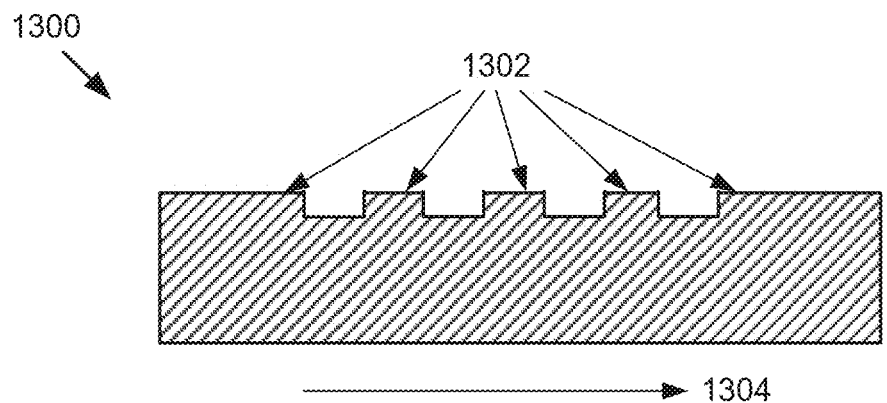
FIG. 13 is a block diagram illustrating a cross-sectional view of an example etched Bragg grating.

FIG. 13 is a block diagram illustrating a cross-sectional view of an example Bragg grating 1300, arranged in accordance with at least some embodiments described herein. The Bragg grating 1300 may be formed with aluminum nitride, part of which may be etched out to form etch pitches (e.g., etch pitches 1302). An effective index of refraction may vary in an etched section where the etch pitches locate, causing the index of refraction to change periodically in a direction 1304. The etch pitches may be designed to reflect or transmit a wavelength.

In FIG. 13, the etch pitches 1302 and air between the etch pitches 1302 may create an optical grating such as a Bragg grating. Alternatively, the etch pitches 1302 may be formed by first AlN with a first nitrogen concentration level. Second AlN with a second nitrogen concentration level (e.g., lower than the first nitrogen concentration level) may be filled between the etch pitches 1302 so that the first AlN and the second AlN may form an optical grating.

Figure 14:
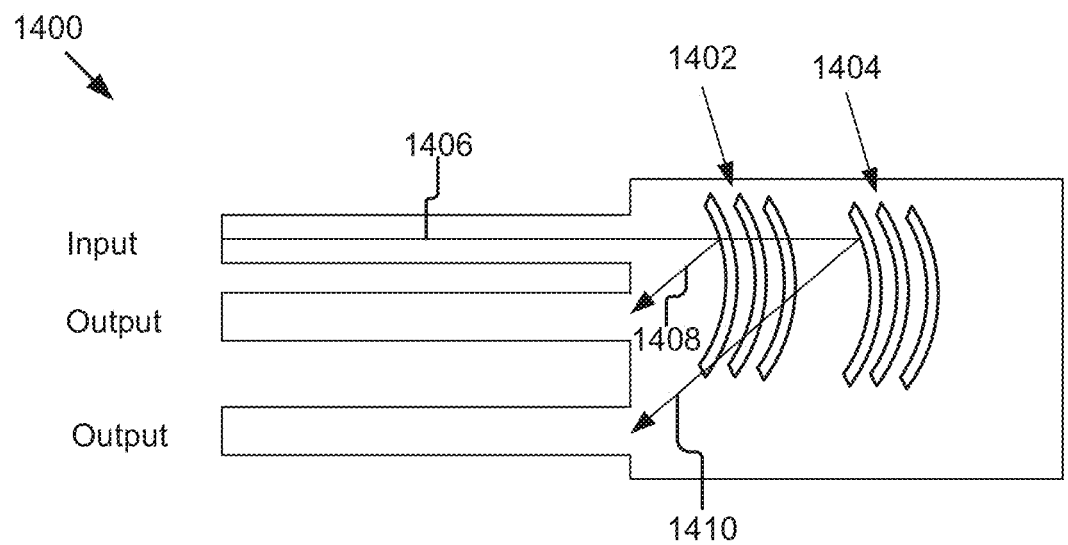
FIG. 14 is a block diagram illustrating an example wavelength division multiplexing (WDM) device that includes distributed Bragg reflectors formed by etched Bragg gratings similar or identical to the etched Bragg grating of FIG. 13.

FIG. 14 is a block diagram illustrating an example WDM device 1400 that includes distributed Bragg reflectors 1402 and 1404, arranged in accordance with at least some embodiments described herein. The WDM device 1400 may include a WDM filter. The distributed Bragg reflectors 1402 and 1404 may be formed by etched Bragg gratings similar or identical to the etched Bragg grating 1300 of FIG. 13. Using a focusing distributed Bragg reflector, a light beam may diverge in plane and be focused to a different output. Pitches of the distributed Bragg reflector may be adjusted to reflect an optical signal with a first wavelength while transmitting another optical signal with another wavelength to a next focusing distributed Bragg reflector.

For example, an input light beam 1406 may include optical signals with different wavelengths. The distributed Bragg reflector 1402 may be configured to reflect a first optical signal with a first wavelength while transmitting a second optical signal with a second wavelength. For example, the distributed Bragg reflector 1402 may reflect the first optical signal with the first wavelength at a first angle so that the first optical signal is a first output signal 1408 from the WDM device 1400. Meanwhile, the distributed Bragg reflector 1402 may transmit the second optical signal with the second wavelength to the distributed Bragg reflector 1404. The distributed Bragg reflector 1404 may be configured to reflect the second optical signal at a second angle so that the second optical signal is a second output signal 1410 from the WDM device 1400.

With combined reference to FIGS. 10-14, some embodiments described herein may include an optical waveguide. The optical waveguide may include a layer of high-frequency polymer, a first AlN thin film disposed on top of the layer of high-frequency polymer, and a second AlN thin film embedded in or surrounded by the first AlN thin film. The first AlN thin film may include nitrogen content with a first nitrogen concentration level and a first index of refraction. The second AlN thin film may include nitrogen content with a second nitrogen concentration level and a second index of refraction. The first nitrogen concentration level (e.g., 85%) may be lower than the second nitrogen concentration level (e.g., 90%), the first index of refraction may be lower than the second index of refraction, and the second AlN thin film may be embedded in the first AlN thin film to guide a light beam to propagate through the second AlN thin film. The first AlN thin film and the second AlN thin film may form a trench waveguide. Alternatively, a ridge waveguide may be formed.

In some embodiments, optical waveguides (trench or ridge waveguides) may be formed using: (1) selective doping of aluminum nitride with oxygen and/or nitrogen; and/or (2) etching the AlN to form etch pitches, with air left between the etch pitches or deposing different stoichiometric content between the etch pitches.

In some embodiments, the second AlN thin film may be selectively etched to form an etched Bragg grating configured to reflect or transmit an optical signal with a particular wavelength. Alternatively or additionally, the second AlN thin film may be selectively etched to form distributed Bragg reflectors that operate as a WDM filter.

Figure 15:
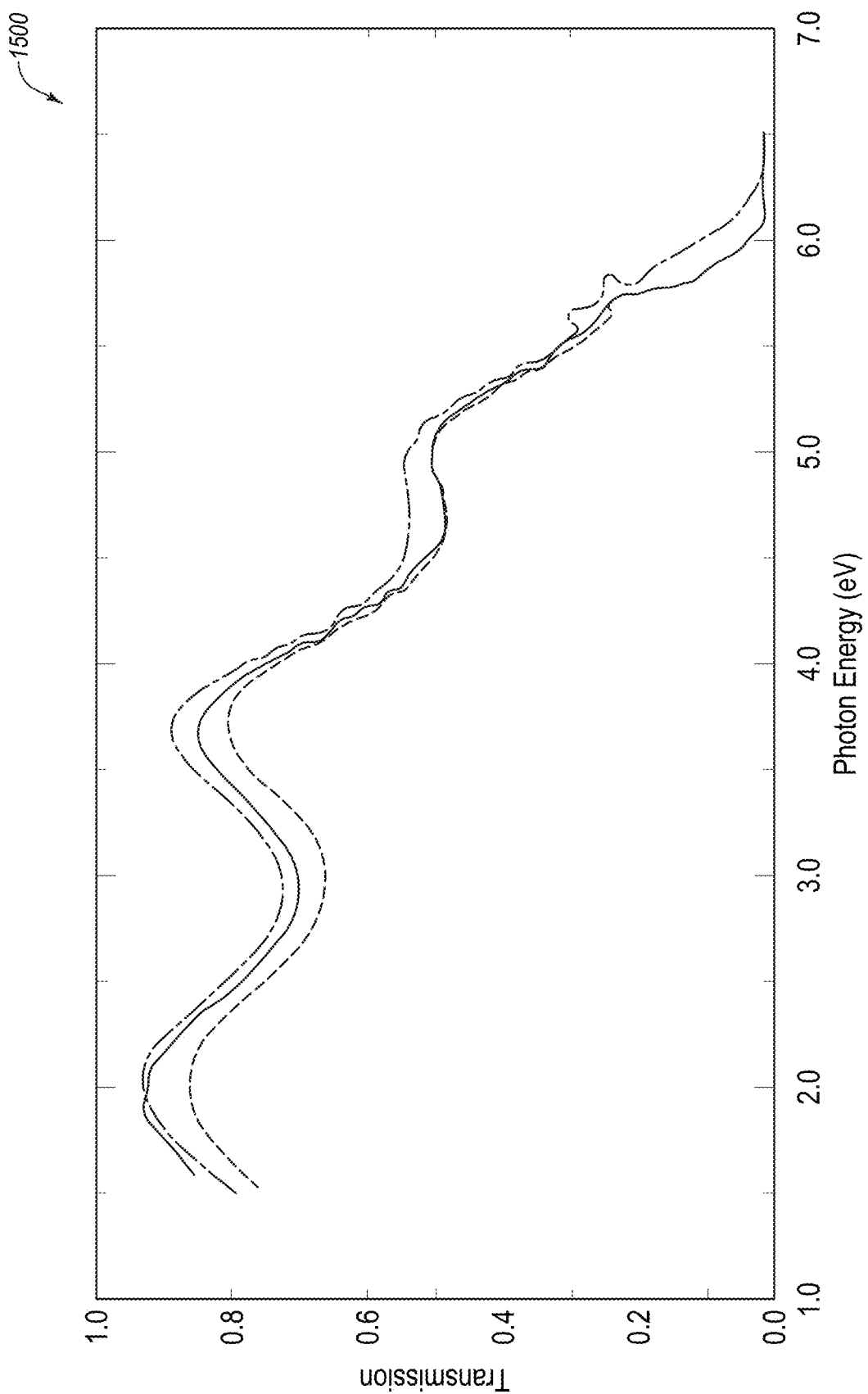
FIG. 15 is a graphic representation illustrating an example relationship between a transmission rate and an index of refraction for Aluminum nitride.

FIG. 15 is a graphic representation 1500 illustrating an example relationship between optical transmission and photon energy for AlN and $Al_2O_3$, arranged in accordance with at least some embodiments described herein. FIG. 15 shows that AlN is highly transmissive and may be used to form waveguides.

Figure 16:
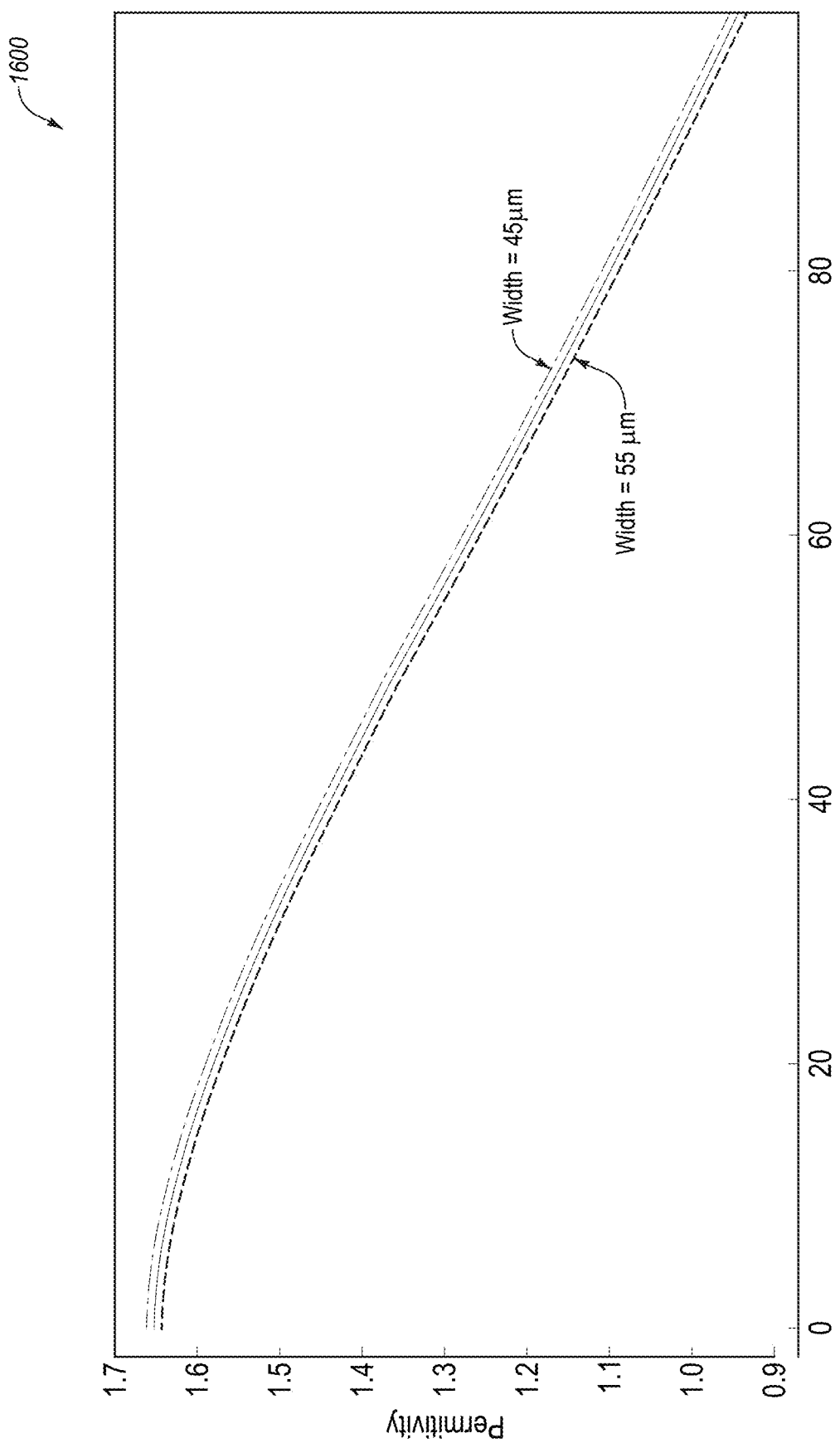
FIG. 16 is a graphic representation illustrating example effective permittivity curves for a circuit stack-up.

FIG. 16 is a graphic representation 1600 illustrating effective permittivity curves for a circuit stack-up, arranged in accordance with at least some embodiments described herein. The circuit stack-up may include an AlN substrate disposed on top of a PCB substrate. Detail of the circuit stack-up is provided in Table 1 below.

TABLE 1 a circuit stack-up

| Layer | Material | Thickness | Permeability, e | Angle, Tan d |
|---|---|---|---|---|
| Top - 1 | Aluminum Nitride | 12 micrometers | 9.2 | 0.0021 |
| 2 | Kapton Foil | 25 micrometers | 3.4 | 0.0018 |
| 3 | MEG tron VI | 98 micrometers | 3.6 | 0.004 |
| 4 | MEG tron VI | 106 micrometers | 3.6 | 0.004 |
| 5 | MEG tron VI | 148 micrometers | 3.2 | 0.004 |
| Bottom - 6 | MEG tron VI | 150 micrometers | 3.5 | 0.004 |

The effective permittivity curves in FIG. 16 are simulated with the following parameters: a trace width between 45 micrometers and 55 micrometers, a trace thickness of 15 micrometers, and a trace length of 100 micrometers.

Figure 17A:
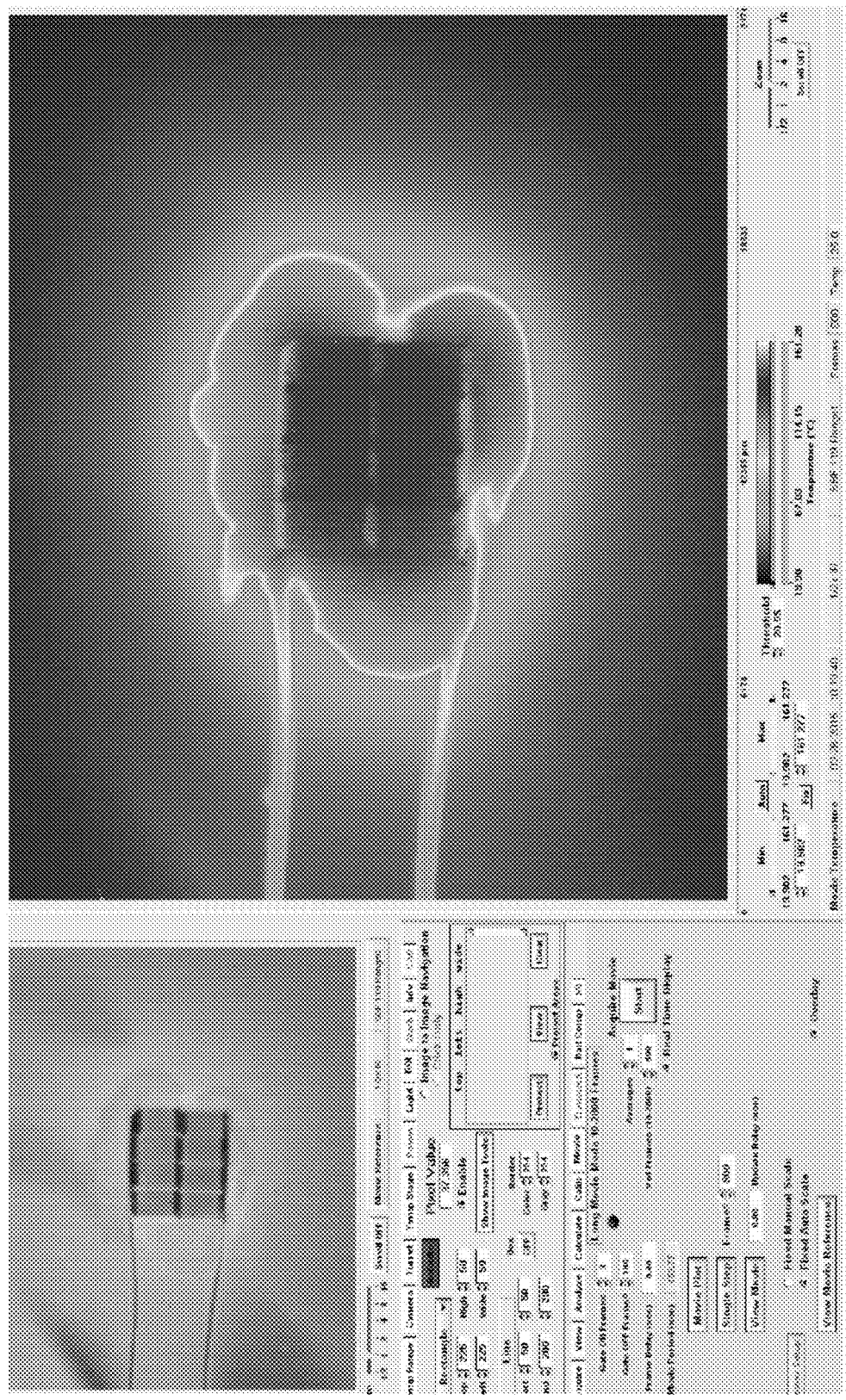
FIG. 17A is a graphic representation illustrating an example thermal scan of a heat load on a kapton side.

FIGS. 17A-17E illustrate example infrared (IR) thermal scans using a quantum focus instrument (QFI) IR camera microscope. FIG. 17A is a graphic representation 1700 illustrating an example thermal scan of a heat load on a kapton side, arranged in accordance with at least some embodiments described herein. The heat load may include a load of 0.3 A/3V. Heat generated by the heat load is generally not able to spread out laterally. For example, the heat is not able to spread out in an x-y plane such as a plane of the drawing sheet.

Figure 17B:
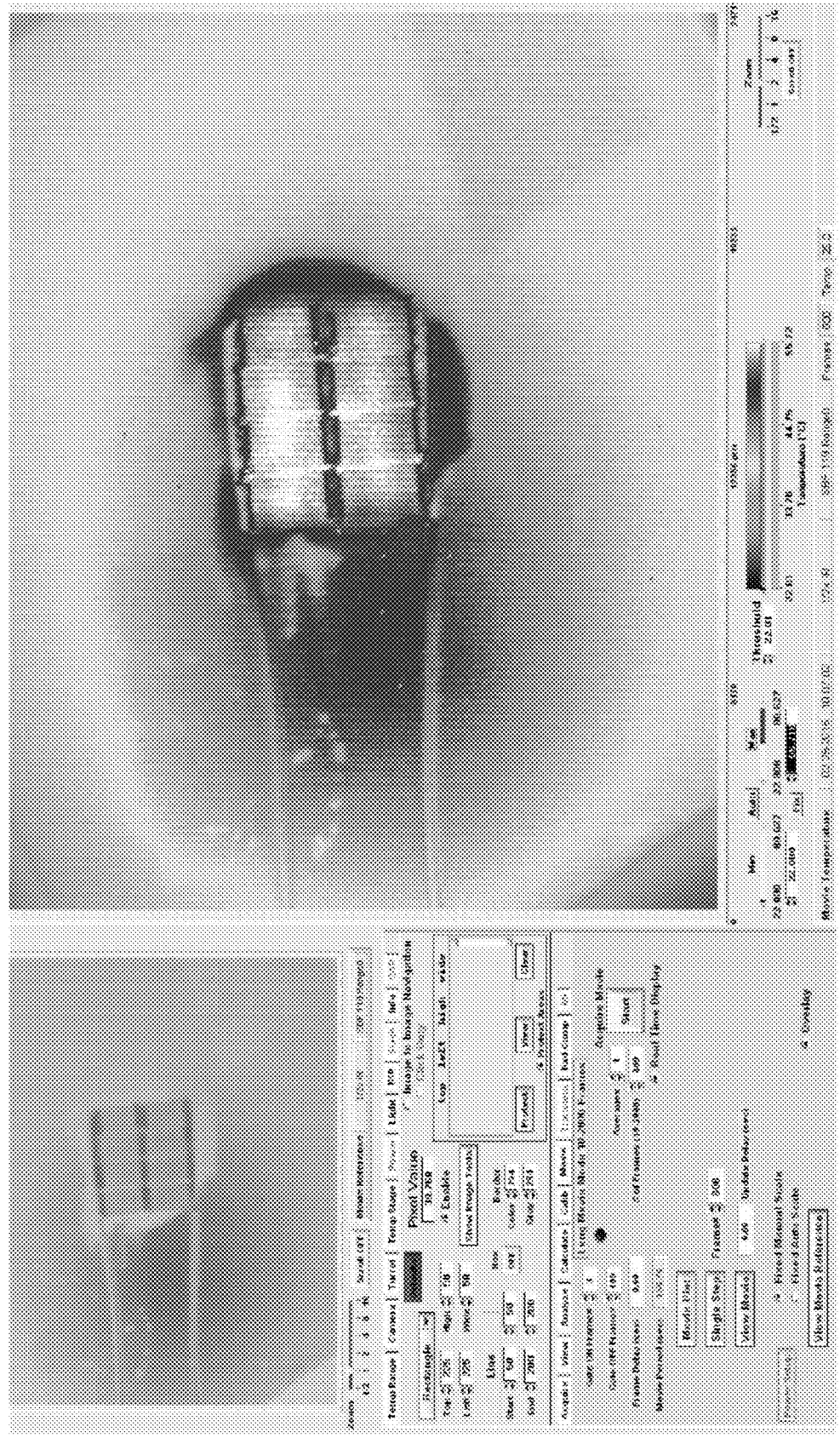
FIG. 17B is a graphic representation illustrating an example thermal scan of a heat load on an AlN substrate.

FIG. 17B is a graphic representation 1710 illustrating an example thermal scan of a heat load on an AlN substrate, arranged in accordance with at least some embodiments described herein. The heat load may include a load of 0.3 A/3V. The AlN substrate may include an AlN thin film with a thickness of 9 micrometers and a kapton foil with a thickness of 25 micrometers on a 3 millimeter (mm) by 3 mm sample resistor pack. FIG. 17B shows that heat generated by the heat load is generally able to spread out laterally with the AlN substrate for a faster dissipation, compared to the thermal simulation of FIG. 17A with kapton only. In some embodiments, it may only take a few milliseconds for the heat to spread out laterally through the AlN substrate.

Figure 17C:
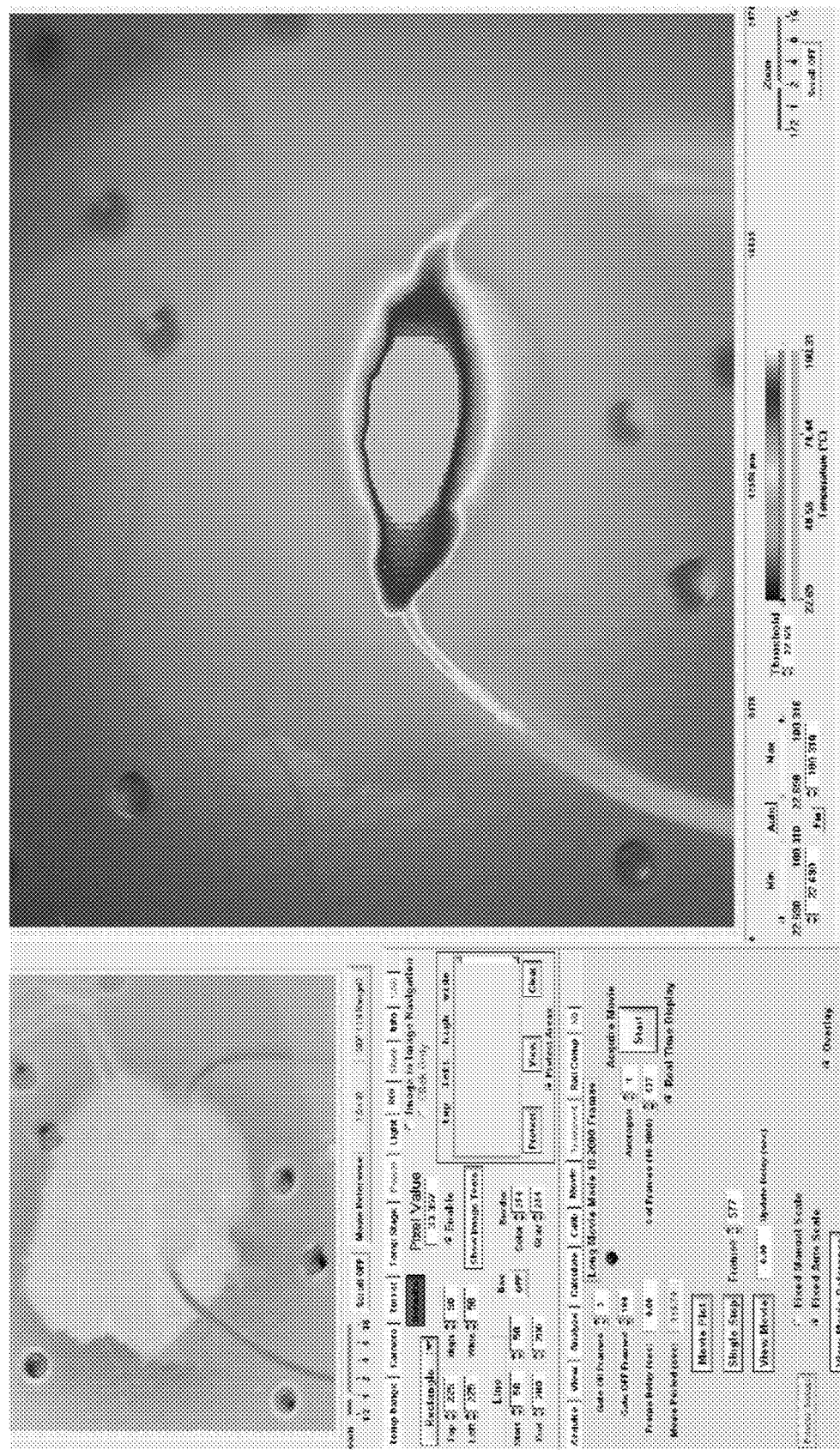
FIG. 17C is a graphic representation illustrating an example thermal scan of a heat load on a flame retardant four (FR4) substrate of a PCB.

FIG. 17C is a graphic representation 1720 illustrating an example thermal scan of a heat load on an FR4 substrate of a PCB, arranged in accordance with at least some embodiments described herein. The heat load may include a load of 0.3 A/1V. Heat generated by the heat load is generally not able to spread out laterally. For example, the heat is not able to spread out in an x-y plane such as a plane of the drawing sheet.

Figure 17D:
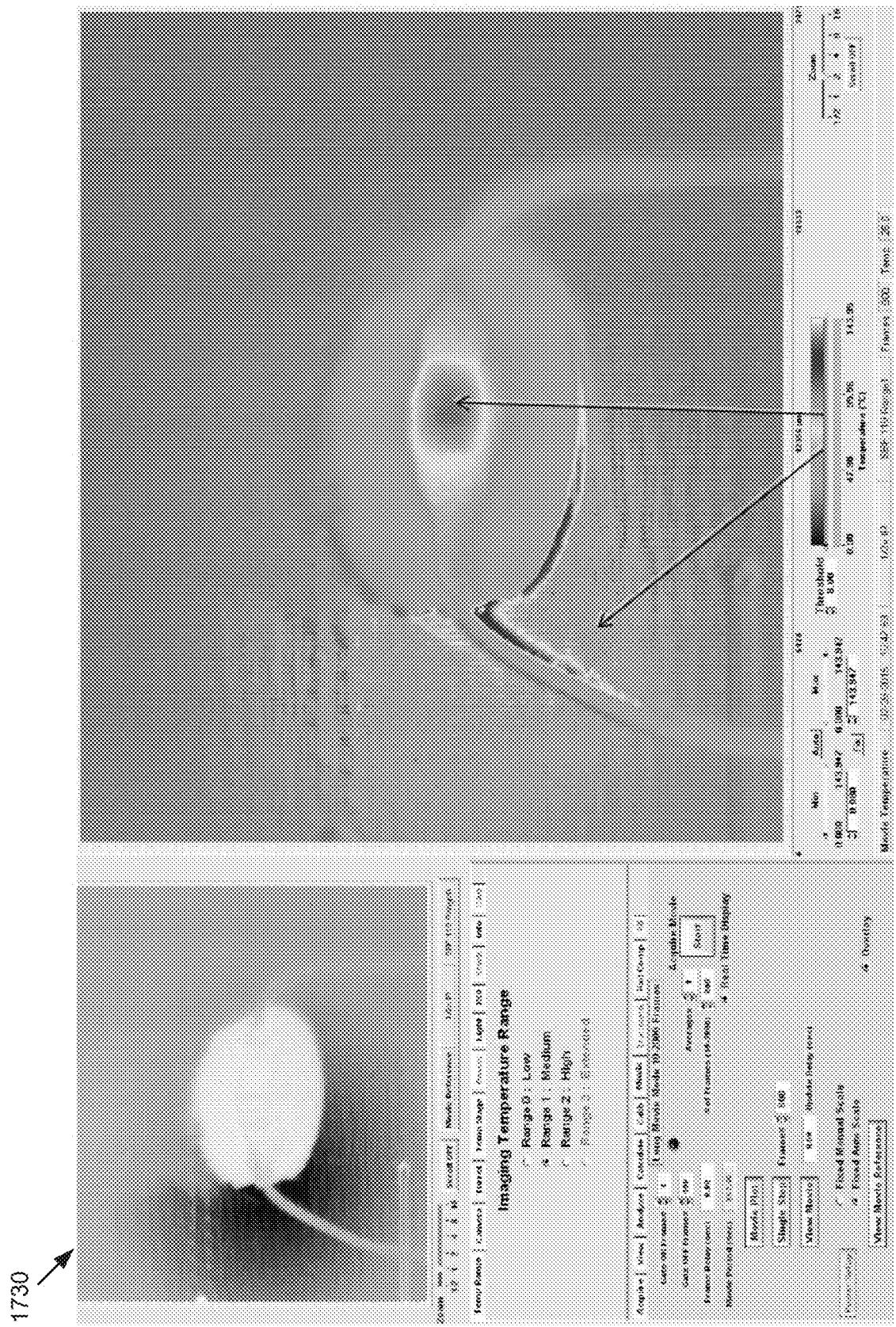
FIG. 17D is a graphic representation illustrating an example thermal scan of a heat load on a silver-plated PCB substrate.

FIG. 17D is a graphic representation 1730 illustrating an example thermal scan of a heat load on a silver plated PCB substrate, arranged in accordance with at least some embodiments described herein. The heat load may include a load of 0.3 A/1V. Compared to the thermal simulation of FIG. 17C, heat generated by the heat load is able to spread out more widely for a faster dissipation than that of FIG. 17C.

Figure 17E:
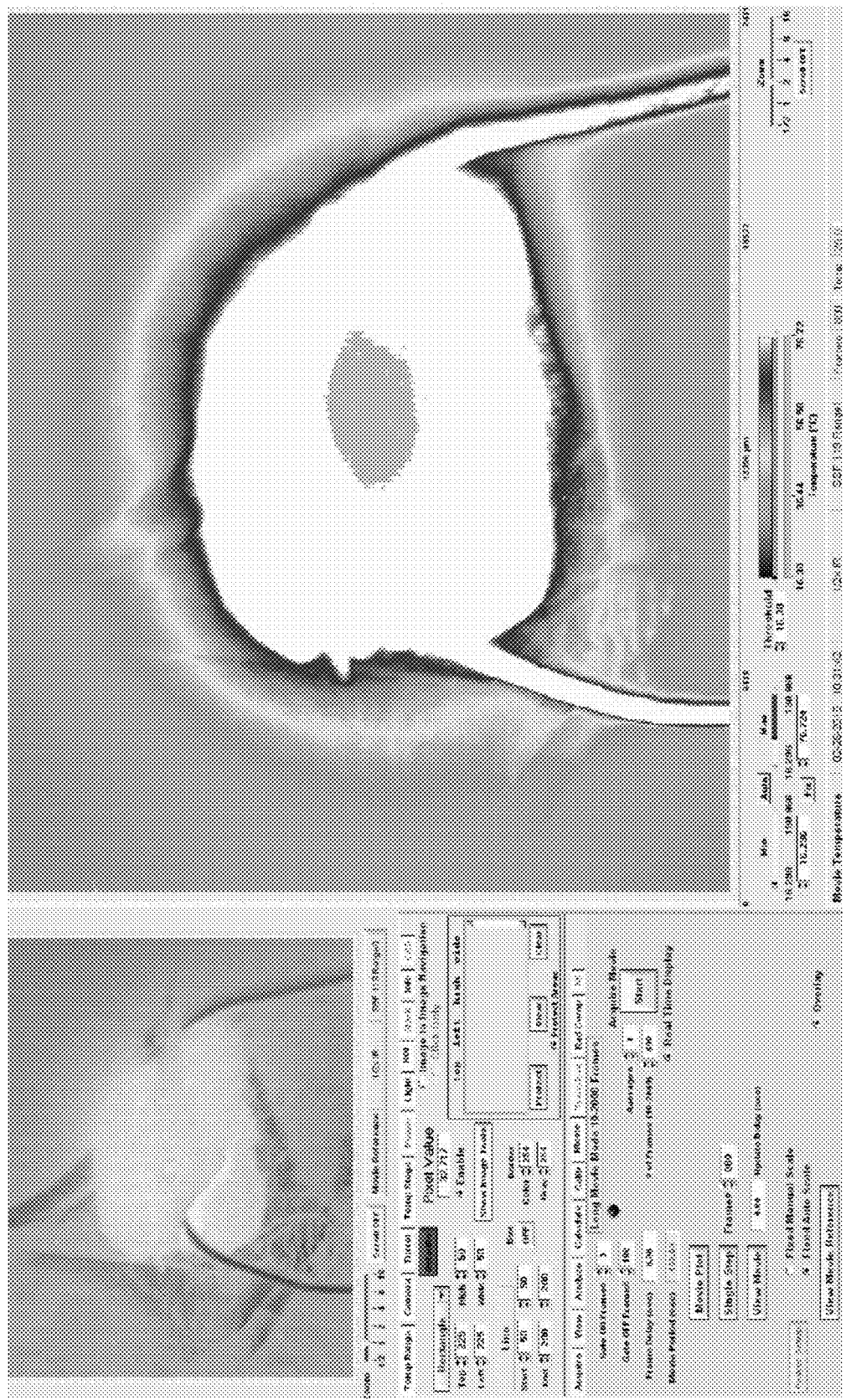
FIG. 17E is a graphic representation illustrating an example thermal scan of a heat load on an AlN substrate.
Figure 17E:

FIG. 17E is a graphic representation 1740 illustrating an example thermal scan of a heat load on an AlN substrate, arranged in accordance with at least some embodiments described herein. The heat load may include a load of 0.5 A/3V. The AlN substrate may include an AlN thin film with a thickness of 13 micrometers and a kapton foil with a thickness of 25 micrometers. FIG. 17E shows that heat generated by the heat load is generally able to spread out laterally with the AlN substrate for a faster dissipation, compared to the thermal simulation of FIG. 17C with the FR4 substrate and the thermal simulation of FIG. 17D with silver plating.

Figure 18:
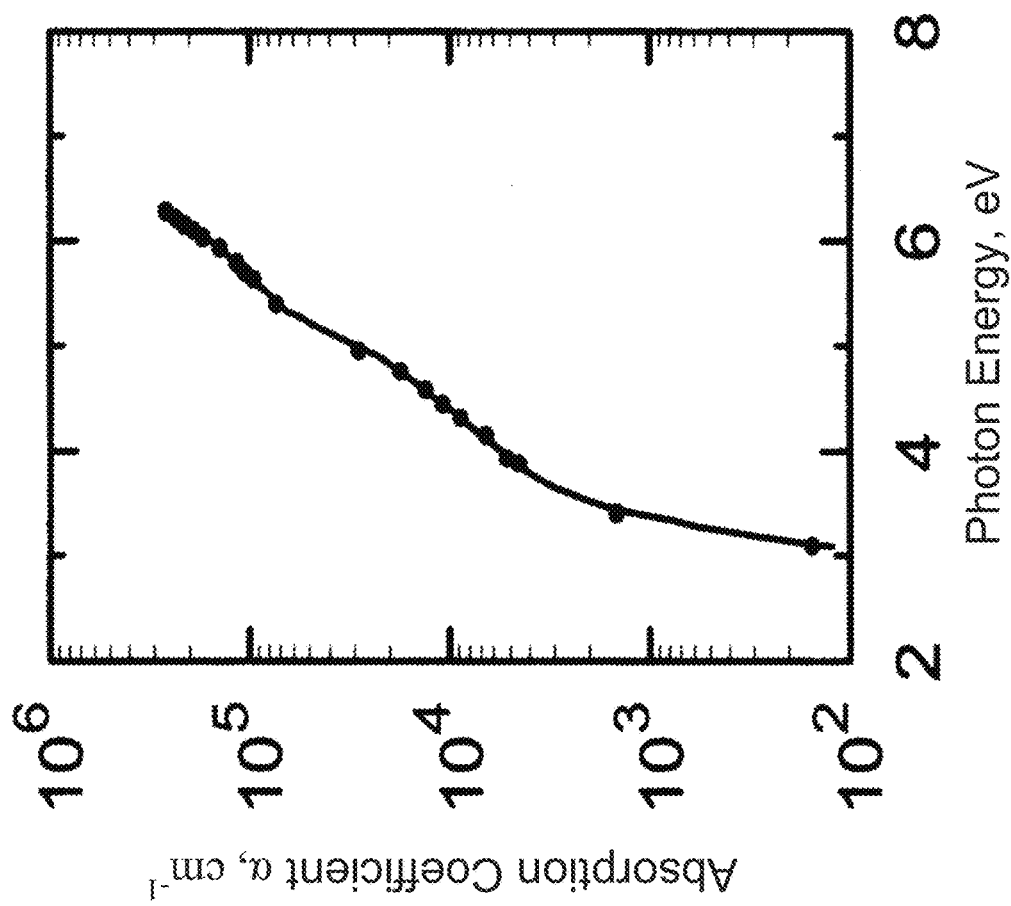
FIG. 18 is a graphic representation illustrating example relationship between photon energy and an absorption coefficient for Aluminum nitride.

FIG. 18 is a graphic representation 1800 illustrating example relationship between photon energy and an absorption coefficient α for Aluminum nitride, arranged in accordance with at least some embodiments described herein.

Figure 19:
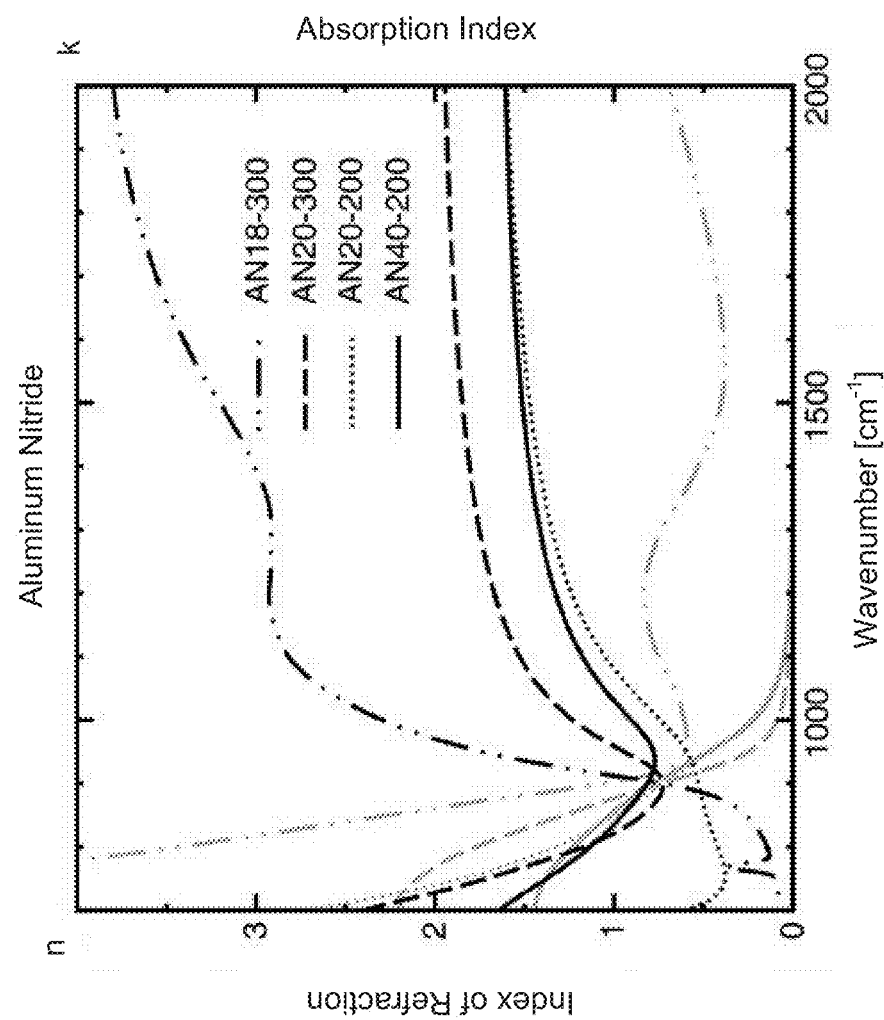
FIG. 19 is a graphic representation illustrating example relationship between an index of refraction and a wavenumber and example relationship between an absorption index and the wavenumber for Aluminum nitride.

FIG. 19 is a graphic representation 1900 illustrating example relationship between an index of refraction and a wavenumber and example relationship between an absorption index and the wavenumber for Aluminum nitride, arranged in accordance with at least some embodiments described herein.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical waveguide comprising:
   a first aluminum nitride (AlN) thin film disposed on a layer of high-frequency polymer; and
   a second AlN thin film embedded in the first AlN thin film;
   wherein a first nitrogen concentration level of the first AlN thin film is different than a second nitrogen concentration level of the second AlN thin film.

2. The AlN substrate of claim 1, wherein the AlN substrate is at least partially transparent and a first index of refraction of the first AlN thin film is different than a second index of refraction of the second AlN thin film.

3. The AlN substrate of claim 2, wherein the AlN substrate is between 85%-90% transparent for wavelengths between 850 nanometers and 1550 nanometers.

4. The AlN substrate of claim 1, wherein the second AlN thin film is embedded in the first AlN thin film to guide a light beam to propagate through the second AlN thin film.

5. The optical waveguide of claim 1, wherein the first AlN thin film and the second AlN thin film form a trench waveguide.

6. The optical waveguide of claim 1, wherein the second AlN thin film is selectively etched to form one or more of:
   an etched Bragg grating configured to reflect or transmit an optical signal with a particular wavelength; or
   distributed Bragg reflectors that operate as a wavelength division multiplexing (WDM) filter.

* * * * *